United States Patent
Park et al.

(10) Patent No.: US 10,268,575 B2
(45) Date of Patent: Apr. 23, 2019

(54) NONVOLATILE MEMORY DEVICE AND MEMORY SYSTEM INCLUDING THE SAME

(71) Applicant: SAMSUNG ELECTRONICS CO., LTD., Suwon-si, Gyeonggi-do (KR)

(72) Inventors: Ji-Yoon Park, Suwon-si (KR); Hyun-Wook Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/813,903

(22) Filed: Nov. 15, 2017

(65) Prior Publication Data

US 2018/0203796 A1     Jul. 19, 2018

(30) Foreign Application Priority Data

Jan. 18, 2017  (KR) .................... 10-2017-0008778

(51) Int. Cl.
| | | |
|---|---|---|
| G06F 12/02 | (2006.01) | |
| H01L 27/115 | (2017.01) | |
| G11C 16/04 | (2006.01) | |
| G11C 16/34 | (2006.01) | |
| G11C 16/10 | (2006.01) | |

(52) U.S. Cl.
CPC ...... *G06F 12/0246* (2013.01); *G11C 16/0483* (2013.01); *G11C 16/10* (2013.01); *G11C 16/3431* (2013.01); *G11C 16/3459* (2013.01); *H01L 27/115* (2013.01); *G11C 2216/14* (2013.01)

(58) Field of Classification Search
CPC . G06F 12/0246; G11C 16/0483; G11C 16/10; G11C 16/3431; G11C 16/3459; H01L 27/115
USPC .......................... 365/230.01–243.5
See application file for complete search history.

(56) References Cited

U.S. PATENT DOCUMENTS

| | | |
|---|---|---|
| 6,160,750 A | 12/2000 | Shieh |
| 6,466,488 B2 | 10/2002 | Sowards et al. |
| 6,621,739 B2 | 9/2003 | Gonzalez et al. |
| 7,193,921 B2 | 3/2007 | Choi et al. |
| 7,679,133 B2 | 3/2010 | Son et al. |
| 7,701,764 B2 | 4/2010 | Nguyen |
| 7,751,250 B2 | 7/2010 | Lee et al. |
| 8,456,905 B2 | 6/2013 | Kasorla et al. |
| 8,553,466 B2 | 10/2013 | Han et al. |
| 8,559,235 B2 | 10/2013 | Yoon et al. |
| 8,587,357 B2 | 11/2013 | Kim et al. |
| 8,654,587 B2 | 2/2014 | Yoon et al. |
| 8,854,900 B2 | 10/2014 | Lee et al. |
| 9,123,400 B1 | 9/2015 | Yang et al. |
| 9,261,940 B2 | 2/2016 | Kim et al. |
| 9,432,298 B1 * | 8/2016 | Smith ................. H04L 49/9057 |
| 9,443,600 B2 | 9/2016 | Ghalam et al. |

(Continued)

*Primary Examiner* — Harry W Byrne
(74) *Attorney, Agent, or Firm* — F. Chau & Associates, LLC

(57) ABSTRACT

A nonvolatile memory device includes control logic and a memory cell array. The memory cell array includes a first plane and a second plane. The control logic is configured to perform a first sub-operation on the first plane, to perform a second sub-operation on the second plane, to delay the second sub-operation as much as a reference time so that a partial section of the first sub-operation does not overlap the second sub-operation, and to variably control the reference time.

20 Claims, 17 Drawing Sheets

(56) References Cited

U.S. PATENT DOCUMENTS

2011/0233648 A1    9/2011  Seol et al.
2016/0218716 A1    7/2016  Tran et al.

\* cited by examiner

FIG. 3
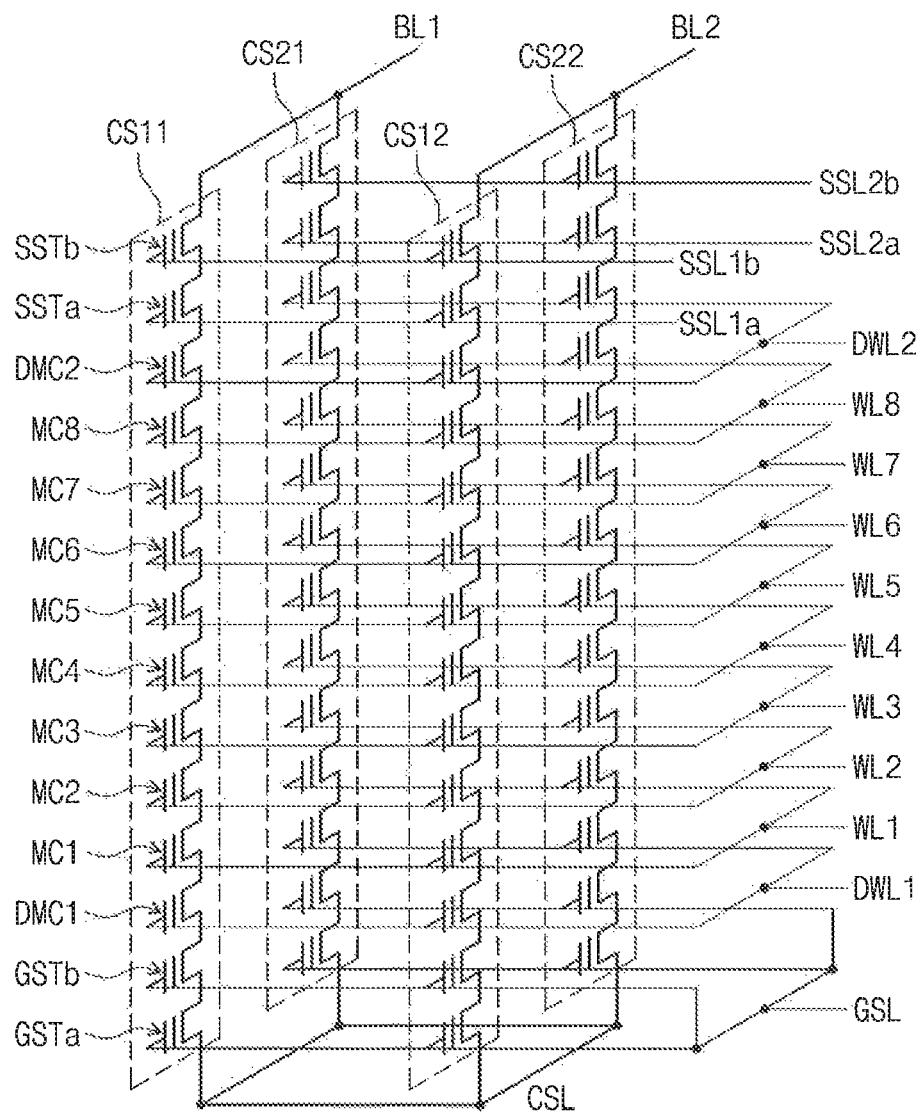
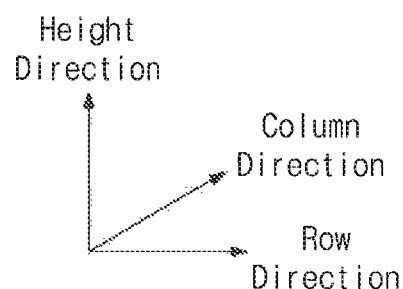

FIG. 8

STT1

| Vrd_LEV | SPD_T |
|---|---|
| Vrd_G1 (Vrd1~Vrd2) | SPD_T11 |
| Vrd_G2 (Vrd3~Vrd5) | SPD_T12 |
| Vrd_G3 (Vrd6~Vrd7) | SPD_T13 |

| Vrd_LEV | SPD_T |
|---------|--------|
| Vrd1 | SPD_T21 |
| Vrd2 | SPD_T22 |
| Vrd3 | SPD_T23 |
| Vrd4 | SPD_T24 |
| Vrd5 | SPD_T25 |
| Vrd6 | SPD_T26 |
| Vrd7 | SPD_T27 |

STT2

FIG. 15

STT3

| PGM_LOOP | SPD_T |
|---|---|
| PL1 | SPD_T31 |
| PL2 | SPD_T32 |
| ⋮ | ⋮ |
| PLn | SPD_T3n |

NONVOLATILE MEMORY DEVICE AND MEMORY SYSTEM INCLUDING THE SAME

CROSS-REFERENCE TO RELATED APPLICATIONS

This U.S. non-provisional patent application claims priority under 35 U.S.C. § 119 from Korean Patent Application No. 10-2017-0008778, filed on Jan. 18, 2017, the entire contents of which are incorporated by reference herein.

TECHNICAL FIELD

The inventive concept relates to storage devices, and more particularly, to a nonvolatile memory and a memory system including the nonvolatile memory.

DISCUSSION OF THE RELATED ART

A semiconductor memory device may be implemented using a semiconductor such as silicon Si, germanium Ge, gallium arsenide GaAs, indium phosphide InP, etc. A semiconductor memory device may be classified as a volatile memory device, or a nonvolatile memory device.

A volatile memory device loses its stored data when power delivered from a power source is interrupted. Examples of the volatile memory device are a static RAM (SRAM), a dynamic RAM (DRAM), a synchronous DRAM, etc. In contrast to a volatile memory device, a nonvolatile memory device retains its stored data even when a power delivery from a power source is interrupted. Examples of the nonvolatile memory device include, for example, a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), a ferroelectric RAM (FRAM), etc.

As semiconductor technology continues to advance, a storage device based on a flash memory is being developed. A flash memory reads or writes data on a per-page basis and erases data on a per-block basis. Although a flash memory has a high read speed when compared with a conventional hard disk, the flash memory has a physical characteristic incapable of performing an overwrite operation. Due to the physical characteristic of the flash memory, a significant amount of time is required to perform an erase operation rather than overwriting data.

SUMMARY

According to the inventive concept, a nonvolatile memory device includes a memory cell array including a first plane and a second plane; and a control logic circuit configured to execute a first sub-operation on the first plane, and to execute a second sub-operation on the second plane, wherein the control logic circuit is further configured to control a delay of an execution of the second sub-operation according to a reference time so that execution of a particular section of the first sub-operation does not overlap execution of the second sub-operation, and the control logic circuit is configured to vary the reference time to increase or decrease the delay of the execution of the second sub-operation, wherein the particular section of the first sub-operation indicates a noise section where a power noise occurs, and wherein the second sub-operation indicates an operation of a victim section affected by the power noise.

The nonvolatile memory device may further include an address decoder connected to the memory cell array through a plurality of word lines; an i/o circuit connected to the memory cell array through a plurality of bit lines; a voltage generator configured to generate voltages, which are provided to the address decoder in response to receiving a control signal, wherein the voltage generator generates word line voltages including at least one of a program voltage, a pass voltage, and a program verification voltage.

According to the inventive concept, a memory system may include a nonvolatile memory device configured to include a first area and a second area, to execute a first sub-operation on the first area, to execute a second sub-operation on the second area, and to delay execution of the second sub-operation according to a reference time so that execution of a particular section of the first sub-operation does not overlap execution of the second sub-operation; and a memory controller configured to vary the reference time to increase or decrease the delay of execution of the second sub-operation.

An example embodiment of the inventive concept includes a solid state drive (SSD), including a plurality of memory chips; an SSD controller configured to: control execution of a program operation performed by the plurality of memory chips; determine when operation of a noise section of at least one memory chip from among the memory chips overlaps operation of a victim section of another memory chip from among the plurality of memory chips; and delay execution of the operation of the victim section of the another memory chip based on a reference time.

In the SSD, the plurality of memory chips may be nonvolatile memory chips.

The SSD may include a signal connector that receives a signal from a host, and a power connector that receives power from an external source; and wherein the reference time comprises a suspend time (SPD_T), and a buffer is configured to store a mapping table including a suspend time table of the memory chips.

BRIEF DESCRIPTION OF THE DRAWINGS

FIG. 3 is an exemplary circuit diagram illustrating a memory block included in a nonvolatile memory device of FIG. 1.

FIG. 8 is a mapping table illustrating a suspend time on a read voltage according to example embodiments of the inventive concept.

FIG. 15 is a mapping table illustrating an example suspend time according to a program loop according to example embodiments of the inventive concept.

DETAILED DESCRIPTION

Below, example embodiments of inventive concepts will now be described more fully so that a person of ordinary skill in the art can comprehend and implement the inventive concepts without undue experimentation.

Figure 1:
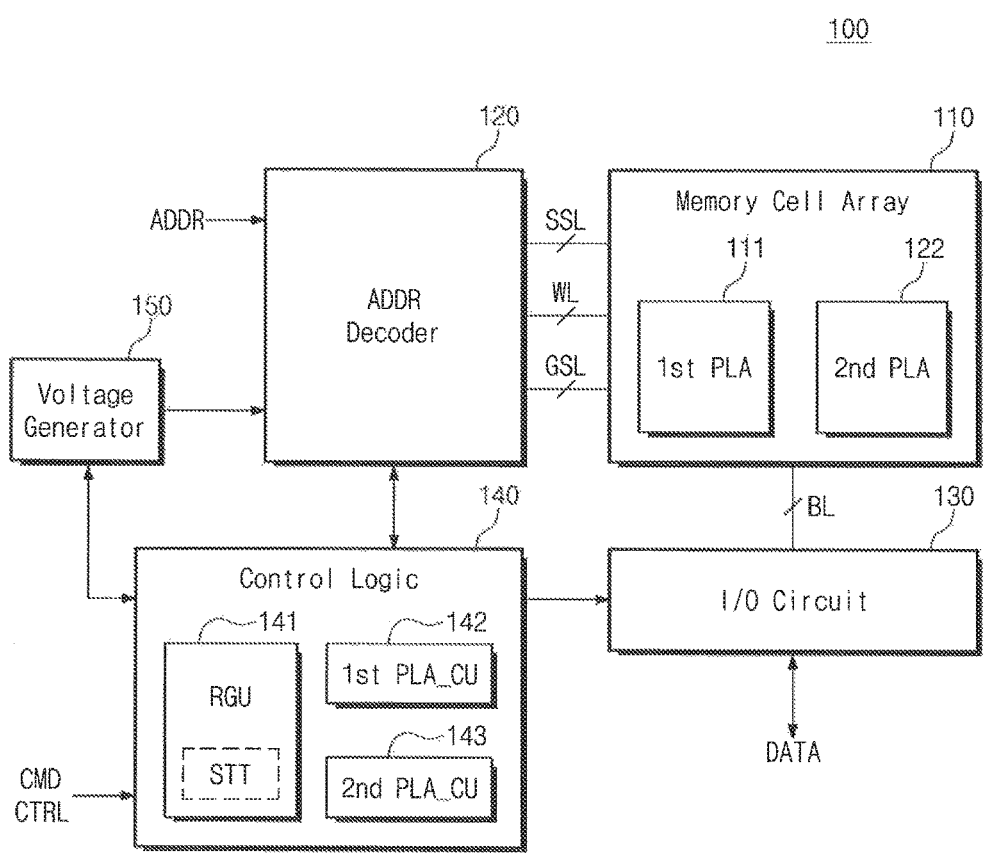
FIG. 1 is a block diagram illustrating a nonvolatile memory device according to example embodiments of the inventive concept.

FIG. 1 is a block diagram illustrating a nonvolatile memory device according to example embodiments of the inventive concept. Referring to FIG. 1, a nonvolatile memory device 100 may include a memory cell array 110, an address decoder 120, an input/output circuit 130, control logic 140, and a voltage generator 150.

The memory cell array 110 may be connected to the address decoder 120 through word lines WL. The memory cell array 110 may be connected to the input/output circuit 130 through bit lines BL. The memory cell array 110 may include at least one plane. For example, the memory cell array 110 may include a first plane 111 and a second plane 112. Each of the first plane 111 and the second plane 112 may include a plurality of memory blocks. The plurality of memory blocks included in each of the first plane 111 and the second plane 112 may share the same bit lines BL.

The address decoder 120 may select at least one page from among a plurality of pages of the memory cell array 110 in response to an address ADDR received from the outside and a control signal of the control logic 140. The address decoder 120 may receive a word line voltage from the voltage generator 150 and may transmit the received word line voltage to a selected page.

For example, the address decoder 120 may select one block from among the plurality of memory blocks of the memory cell array 110 in response to the address ADDR. The address decoder 120 may select one string select line SSL from among string select lines SSL of the selected memory block in response to the address ADDR. The address decoder 120 may select one word line from among word lines WL in response to the address ADDR. One page may be selected by selecting one string select line SSL and one word line WL.

In a program operation, the address decoder 120 may select one page and may transmit a program voltage and a program verification voltage to a word line (e.g., a selected word line WL) of the selected page. The address decoder 120 may transmit a pass voltage to unselected word lines WL (e.g., the selected word line does not receive the pass voltage).

In a read operation, the address decoder 120 may select one page and may transmit a select read voltage to a word line of the selected page. The address decoder 120 may transmit an unselect read voltage to unselected word lines.

With continued reference to FIG. 1, the input/output circuit 130 may receive data (DATA) from the outside and may store the received data in the memory cell array 110. The input/output circuit 130 may read the DATA stored in the memory cell array 110 and may transmit the read DATA to the outside. For example, the input/output circuit 130 may include configuration components such as a column select gate, a page buffer, and a data buffer. For example, the input/output circuit 130 may further include configuration elements such as a write driver and a sense amplifier.

The control logic 140 may receive a command (CMD) and a control signal (CTRL) from the outside and may control an overall operation of the nonvolatile memory device 100 using the received command (CMD) and the control signal (CTRL). For example, the control logic 140 may receive a program command from the outside and may control an overall program operation of the nonvolatile memory device 100. For example, the control logic 140 may receive a read command from the outside and may control an overall read operation of the nonvolatile memory device 100.

The control logic 140 may include a register circuit 141, a first plane control circuit 142, and a second plane control circuit 143.

The register circuit 141 may include a suspend time table (hereinafter it is referred to as STT). The suspend time table may include reference time information used to control an operation of the first and second planes 111 and 112. The control logic 140 may read the suspend time table from the memory cell array 110 when the nonvolatile memory device 100 is booted. For example, the suspend time table STT may be stored in one of the first plane 111 and the second plane 112. More specifically, the suspend time table STT may be stored in meta area of one of the first plane 111 and the second plane 112. For example, the register circuit 141 may be implemented by a separate storage circuit. The register circuit 141 may be implemented by a fuse circuit, and when the nonvolatile memory device 100 is booted, information of the suspend time table STT may be stored in the fuse circuit.

The first plane control circuit 142 may control a read operation and a program operation on the first plane 111. The second plane control circuit 143 may control a read operation and a program operation on the second plane 112. In the case where an operation of generating power noise is performed on the first plane 111 and an operation affected by the power noise is performed in the second plane 112, for example, the second plane control circuit 143 may temporarily delay an operation being performed on the second plane. More specifically, the second plane control circuit 143 may variably adjust a time where an operation of the second plane 112 is delayed based on the suspend time table STT.

In an embodiment of the inventive concept, in a read operation, an operation section in which power noise occurs may be partial sections of a bit line precharge operation, or a whole precharge operation. An operation section affected by power noise may be partial sections of a bit line sensing operation, or a whole sensing operation. In a program operation, the operation section in which power noise occurs may be partial sections of a program bit line setup operation, or a whole setup operation. The operation section affected by power noise may be partial sections of a bit line sensing operation, or a whole sensing operation. A detailed configuration and operation of the control logic 140 will be described with reference to FIG. 2 through FIG. 18.

Below, for brevity of description, an operation section in which power noise occurs is referred to as a "noise section" and an operation section affected by power noise is referred to as a "victim section".

The voltage generator 150 may generate voltages, which are provided to the address decoder 120 in response to receiving a control signal from the control logic 140. In a program operation, for example, the voltage generator 150 may generate word line voltages such as, for example, a program voltage, a pass voltage, and a program verification voltage. In addition, the voltage generator 150 may provide the generated word line voltages to the address decoder 120 under the control of the control logic 140. In a read operation, for example, the voltage generator 150 may generate word line voltages such as, for example, a select read voltage and an unselect read voltage and may provide the generated word line voltages to the address decoder 120 under the control of the control logic 140. In each example, the address decoder 120 may selectively apply the provided word line voltage to word lines WL under a control of the control logic 140.

In embodiments of the inventive concept, the nonvolatile memory device 100 may independently select at least one cell string through a string select line which is exclusively connected to one plane. For example, the string select line may be connected to one plane and corresponds to at least one cell string from among cell strings included in the connected one plane. The nonvolatile memory device 100 may apply, for example, a select voltage to the string select line for independent selection of at least one corresponding cell string. The nonvolatile memory device 100 may apply, for example an unselect (e.g., deselect) voltage to the string select line to independently unselect at least one corresponding cell string. The first plane 111 and the second plane 112 may perform an independent operation.

The number of the planes 111 and 112 included in the memory cell array 110 is not limited to two as shown in the drawings. Two planes are used an example to illustrate the inventive concept and the number of planes may be three or more. The number of plane control units (plane control circuits) of the control unit 140 may be proportional to the number of planes. However, a person of ordinary skill in the art should understand and appreciate that with regard to the inventive concept, a correspondence of plane control circuits to planes may be other than one-to-one.

Figure 2:
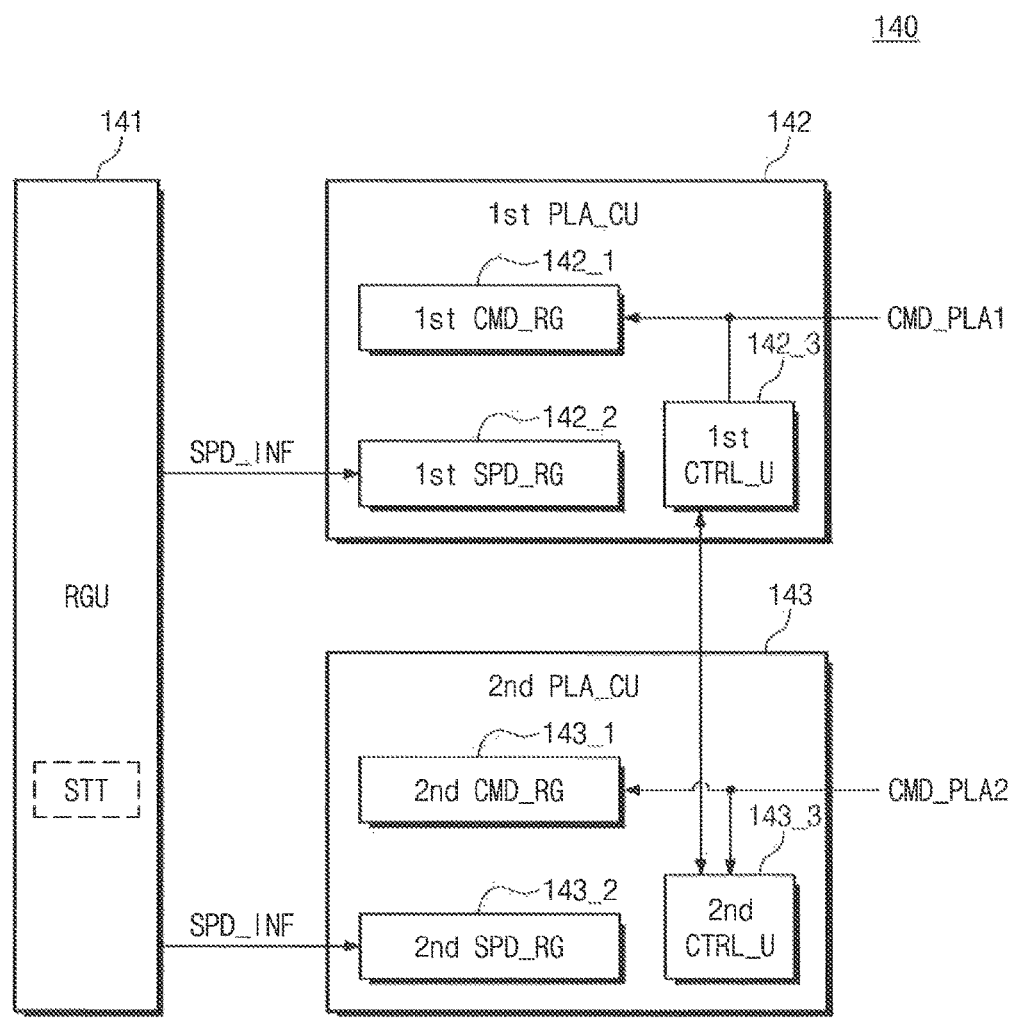
FIG. 2 is a block diagram illustrating control logic of a nonvolatile memory device of FIG. 1 in detail.

FIG. 2 is a block diagram illustrating the control logic 140 of a nonvolatile memory device of FIG. 1 in detail. Referring to FIGS. 1 and 2, the control logic 140 may include, for example, the register circuit 141, the first plane control circuit 142, and the second plane control circuit 143.

The register circuit 141 ("RGU" in FIG. 2), may include the suspend time table STT. The register circuit 141 may provide suspend information (SPD_INF) to at least one of the first plane control circuit 142, and the second plane control circuit 143. The suspend information (SPD_INF) may include time information for the variable control of an operation time, where an operation on the first plane control circuit 142 or the second plane control circuit 143 is delayed.

The first plane control circuit 142 may include a first command register 142_1, a first suspend register 142_2, and a first control unit (e.g., first control circuit) 142_3. The first command register 142_1 may receive a command (CMD_PLA1) on the first plane 111. The first command register 142_1 may temporarily store the command (CMD_PLA1) on the first plane 111. The first suspend register 142_2 may temporarily store suspend information (SPD_INF) received from the register circuit 141.

The first control circuit 142_3 may receive the command (CMD_PLA1) on the first plane 111. In a noise section of the first plane 111, for example, the first control circuit 142_3 may transmit estimation information to the second plane control circuit 143. In addition, in the case where the first plane control circuit 142 receives estimation information from the second plane control circuit 143, the first control circuit 142_3 may read the suspend information (SPD_INF) from the register circuit 141. The first control circuit 142_3 may then temporarily delay an operation to be performed on the first plane 111 based on the suspend information (SPD_INF). In the case where an operation of the first plane 111 is resumed, the first control circuit 142_3 may delete the suspend information (SPD_INF) stored in the first suspend register 142_2.

The second plane control circuit 143 may include a second command register 143_1, a second suspend register 143_2, acid a second control unit (second control circuit) 143_3. The second command register 143_1 may receive a command (CMD_PLA2) on an operation of the second plane 112. The second command register 143_1 may temporarily store a command (CMD_PLA2) on the operation of the second plane 112. The second suspend register 143_2 may temporarily store suspend information (SPD_INF) received from the register circuit 141.

The second control circuit 143_3 may receive the command (CMD_PLA2) on the operation of the second plane 112. In a noise section of the second plane 112, for example, the second control circuit 143_3 may transmit estimation information to the first plane control circuit 142. In the case where the second plane control circuit 143 receives the estimation information from the first plane control unit 142, the second control circuit 143_3 may read the suspend information (SPD_INF) from the register circuit 141. The second control circuit 143_3 may then temporarily delay an operation to be performed on the second plane 112 based on the suspend information (SPD_INF). In the case where an operation of the second plane 112 is resumed, the second control circuit 143_3 may delete suspend information (SPD_INF) stored in the second suspend register 143_2.

Each of the first control circuit 142_3 and the second control circuit 143_3 may include a hardware configuration, a software configuration, and a hybrid configuration thereof to perform the various operations described above and operations to be described later. Each of the first control circuit 142_3 and the second control circuit 143_3 may include a special-purpose hardware circuit constituted to perform a special operation. Each of the first control circuit 142_3 and the second control circuit 143_3 may include at least one processor core that may execute an instruction set of a program code constituted to perform a specific operation.

FIG. 3 is an exemplary circuit diagram illustrating a memory block BLK included in a nonvolatile memory device of FIG. 1. The memory blocks included in each of the first plane 111 and second plane 112 illustrated in FIG. 1 may be implemented as the memory block BLK illustrated in FIG. 3.

Referring to FIG. 3, the memory block BLK includes a plurality of cell strings (CS11, CS12, CS21, CS22). The cell strings (CS11, CS12, CS21, CS22) may be arranged along a row direction and a column direction to form rows and columns.

Each of the cell strings (CS11, CS12, CS21, CS22) may include a plurality of cell transistors. For example, each of the cell strings (CS11, CS12, CS21, CS22) may include string select transistors (SSTa, SSTb), a plurality of memory cells (MC1, MC2, MC3, MC4, MC5, MC6, MC7, and MC8), ground select transistors (GSTa, GSTb), and dummy memory cells (DMC1, DMC2). For example, each of the transistors included in the cell strings (CS11, CS12, CS21, CS22) may be a charge trap flash (CTF) memory cell.

In FIG. 3, the memory cells (MC1~MC8) are arranged between the string select transistors (SSTa, SSTb) and the ground select transistors (GSTa, GSTb).

In addition, the memory cells (MC1~MC8) are serially connected to one another and may be laminated in a height direction (e.g., a Z axis) perpendicular to a plane formed by a row direction and a column direction. The string select transistors (SSTa, SSTb) are serially connected to each other, and the serially connected string select transistors (SSTa, SSTb) are provided between the memory cells (MC1~MC8) and a bit line BL. The ground select transistors (GSTa, GSTb) are serially connected to each other and the serially connected ground select transistors (GSTa, GSTb) are provided between the memory cells (MC1~MC8) and a common source line CSL.

Moreover, a first dummy memory cell DMC1 may be provided between the memory cells (MC1~MC8) and the ground select transistors (GSTa, GSTb). In addition, a second dummy memory cell DMC2 may be provided between the memory cells (MC1~MC8) and the string select transistors (SSTa, SSTb ). The dummy memory cells DMC1, DMC2, respectively arranged at opposite ends of the memory cells (MC1~MC8) may have substantially the same structure as memory cells (MC1~MC8). However, the dummy memory cells DMC1, DMC2, do not perform program and read operations. In other words, the dummy memory cells are not used as data storage elements.

The ground select transistors (GSTa, GSTb) of the cell strings (CS11, CS21, CS12, CS22) may be connected to a ground select line GSL in common. For example, ground select transistors of the same row may be connected to the same ground select line and ground select transistors of different rows may be connected to different ground select lines. For example, the first ground transistors GSTa of the cell strings (CS11, CS12) of the first row may be connected to a first ground select line and the first ground transistors GSTa of the cell strings (CS21, CS22) of the second row may be connected to a second ground select line.

Although not illustrated in the drawings, for example, ground select transistors provided at the same height from a substrate (not illustrated) may be connected to the same ground select line. In addition, ground select transistors provided at different heights from the substrate may be connected to different ground select lines. For example, the first ground transistors GSTa of the cell strings (CS11, CS21, CS12, CS22) may be connected to the first ground select line and the second ground transistors GSTb of the cell strings (CS11, CS21, CS12, CS22) may be connected to the second ground select line.

Memory cells of the same height from the substrate or the ground select transistors (GSTa, GSTb) are connected to the same word line in common and memory cells of different heights from the substrate or the ground select transistors (GSTa, GSTb) are connected to different word lines. For example, the first through eighth memory cells (MC1~MC8) of the cell strings (CS11, CS12, CS21, CS22) are connected to first through eighth word lines (WL1 to WL8) respectively in common.

With continued reference to FIG. 3, string select transistors of the same row among the first string select transistors SSTa of the same height are connected to the same string select line, and string select transistors of different rows are connected to different string select lines. For example, the first string select transistors SSTa of the cell strings (CS11, CS12) of the first row are connected to a string select line SSL1a in common. Moreover, the first string select transistors SSTa of the cell strings (CS21, CS22) of the second row are connected to a string select line SSL2a in common.

Similarly, string select transistors of the same row among the second string select transistors SSTb of the same height are connected to the same string select line and string select transistors of different rows are connected to different string select lines. For example, the second string select transistors SSTb of the cell strings (CS11, CS12) of the first row are connected to a string select line SSL1b in common, and the second string select transistors SSTb of the cell strings (CS21, CS22) of the second row are connected to a string select line SSL2b in common.

Although not illustrated in the drawings, string select transistors of cell strings of the same row may be connected to the same string select line in common. For example, the first and second string select transistors (SSTa, SSTb) of the cell strings (CS11, CS12) of the first row may be connected to the same string select line in common. The first and second string select transistors (SSTa, SSTb) of the cell strings (CS21, CS22) of the second row may be connected to the same string select line in common.

In addition, dummy memory cells DMC of the same height are connected to the same dummy word line DWL and the dummy memory cells arranged at different heights are connected to different dummy word lines respectively. For example, FIG. 3 shows an example where the first dummy memory cell DMC1 is connected to a first dummy word line DWL1 and the second dummy memory cells DMC2 are connected to a second dummy word line DWL2.

The memory block BLK illustrated in FIG. 3 is provided for illustrative purposes, and a person of ordinary skill in the art should understand and appreciate that the inventive concept is not limited to the arrangement shown in FIG. 3. For example, the number of cell strings may increase or decrease, and the number of rows and columns constituted by cell strings may increase or decrease depending on the number of the cell strings. Also, the number of the cell transistors (GST, MC, DMC, SST, etc) of the memory block BLK may increase or decrease, and a height of the memory block BLK may increase or decrease depending on the number of the cell transistors (GST, MC, DMC, SST, etc). The number of the lines (GSL, WL, DWL, SSL, etc) connected to the cell transistors (GST, MC, DMC, SST, etc) may increase or decrease depending on the number of the cell transistors (GST, MC, DMC, SST, etc).

The following patent documents, which are hereby incorporated by reference, describe suitable configurations for a three-dimensional memory block BLK, in which the three-dimensional memory block BLK is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

Figure 4:
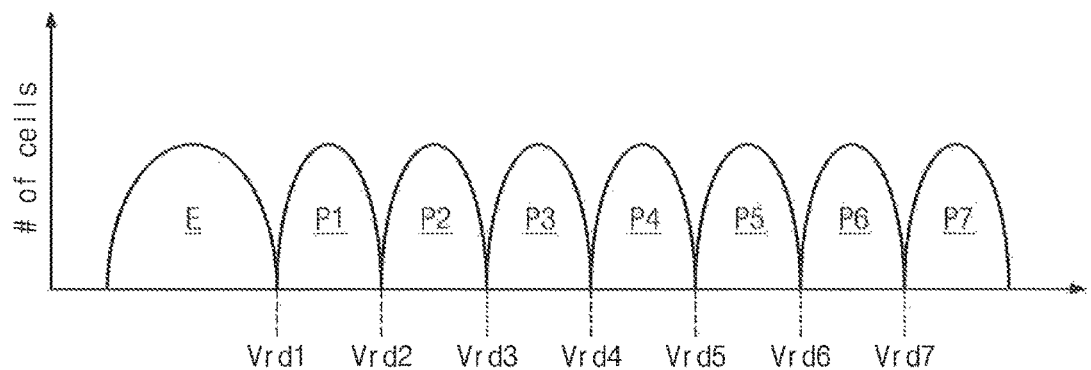
FIG. 4 is a distribution diagram illustrating a distribution of a threshold voltage of a plurality of memory cells included in a nonvolatile memory device of FIG. 1.

FIG. 4 is a distribution diagram illustrating a distribution of a threshold voltage of a plurality of memory cells included in a nonvolatile memory device of FIG. 1. Referring to FIGS. 1 and 4, some (e.g., memory cells connected to one page or one word line) of the memory cells included in the memory cell array 110 may be programmed to have an erase state E, and first through seventh program states (P1 to P7) respectively. For this example, it is assumed that each of the memory cells is programmed to have 3 bits. The nonvolatile memory device 100 may read data stored in the memory cells by detecting a program state (e.g., a threshold voltage of the memory cells) of the memory cells of the memory cell array 110. A person of ordinary skill in the art should understand and appreciate that if the memory cells are programmed to have more than 3 bits, there may be more states than shown in FIG. 4.

For example, the nonvolatile memory device 100 may determine a program state of the memory cells according to a control of the memory controller based on first through seventh read voltages (Vrd1 to Vrd7). The nonvolatile memory device 100 may transmit data DATA to the memory controller according to a determined result.

A section of suspend time may be set up according to a level of a read voltage. The number of on-cells and off-cells of the memory cell array 110 may become different depending on the level of the read voltage. Because of the number of on-cells and off-cells of the memory cell array 110 changing in accordance the level of the read voltage, the amount of leakage current in a bit line precharge operation may become different.

For example, as a level of the read voltage increases, for example, the amount of leakage current in a bit line precharge operation may increase. Accordingly, a magnitude of power noise generated by the leakage current may increase.

For example, the first plane 111 and the second plane 112 may share a power supply. As a level of a read voltage applied to the first plane 111 increases, a magnitude of power noise of the first plane 111 may increase. Since the first plane 111 and the second plane 112 share the power supply, power noise generated in the first plane 111 may affect an operation of the second plane 112. Thus, when a read operation is performed on the first plane 111, a part of an operation of the second plane 112 may be delayed for the suspend time based on a level of a read voltage applied to the first plane 111. A length of the suspend time may be variably adjusted. The suspend time set up according to the level of the read voltage will be described with reference to FIGS. 5 through 7.

Figure 5:
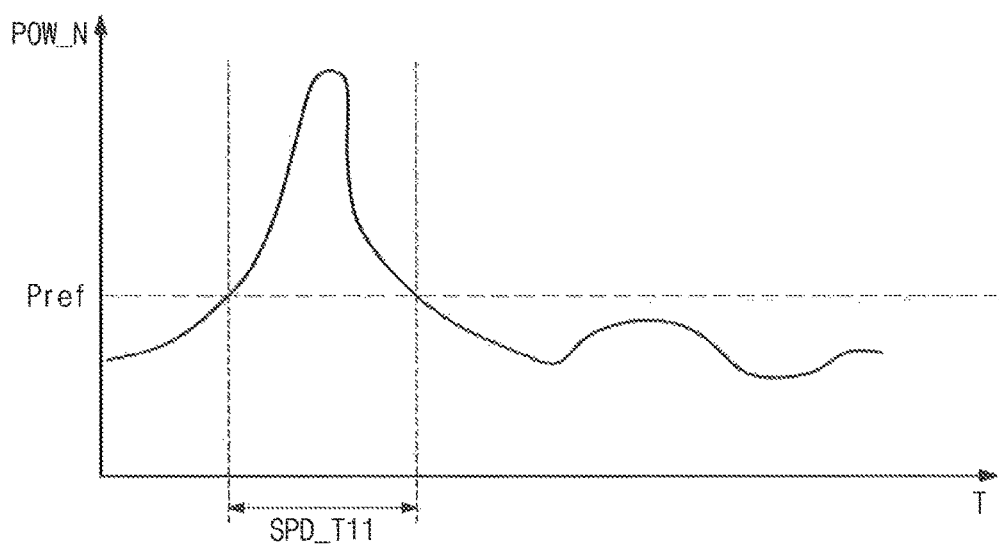
FIG. 5 is a graph illustrating power noise generated when a read voltage included in a first read voltage group (Vrd_G1) is applied.
Figure 6:
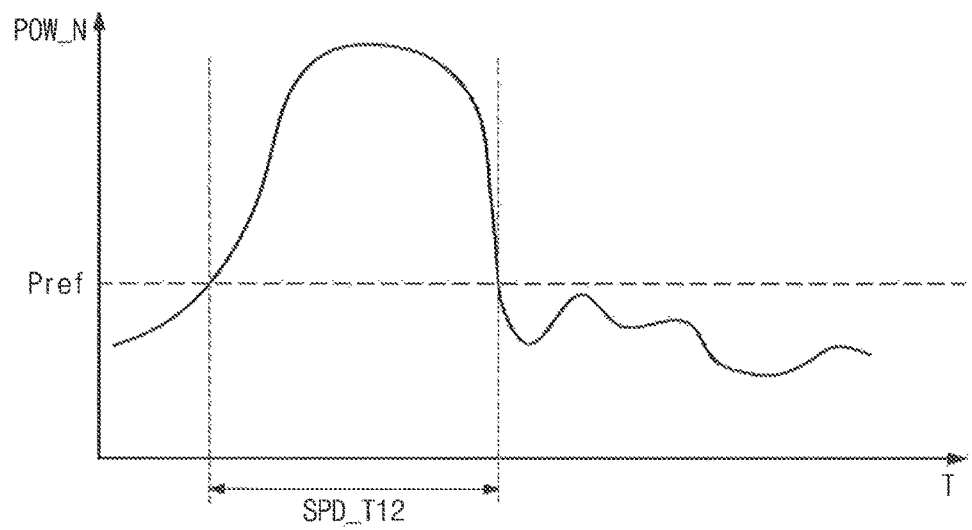
FIG. 6 is a graph illustrating power noise generated when a read voltage included in a second read voltage group (Vrd_G2) is applied.
Figure 7:
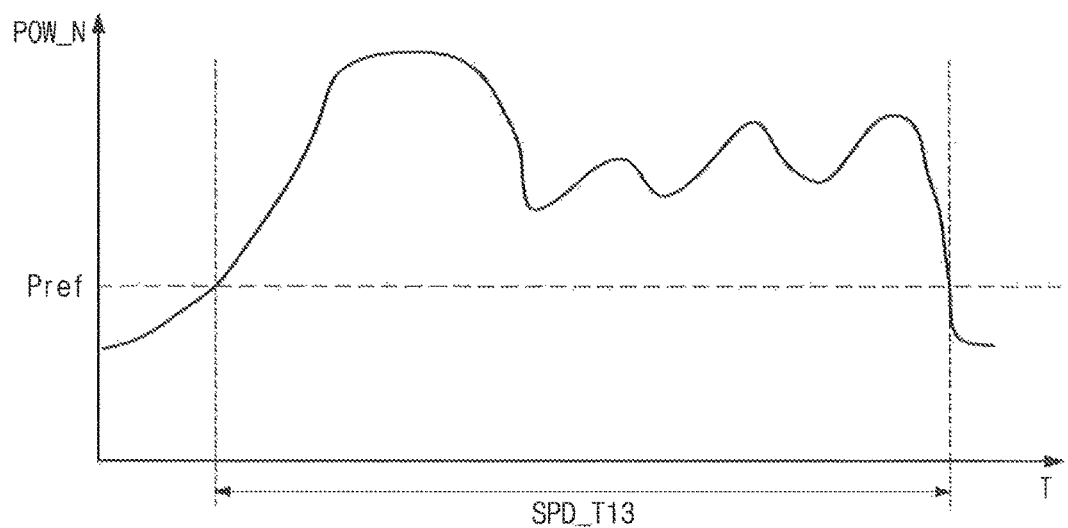
FIG. 7 is a graph illustrating power noise generated when a read voltage included in a third read voltage group (Vrd_G3) is applied.

FIGS. 5 through 7 are graphs illustrating an example of power noise generated according to a read voltage level. To help understanding of the inventive concept, it is assumed that a read voltage is applied to the first plane 111. In each of the graphs illustrated in FIGS. 5 through 7, a horizontal axis indicates time T and a vertical axis indicates power noise POW_N.

FIG. 5 is a graph illustrating power noise generated when a read voltage included in a first read voltage group (Vrd_G1) is applied. Referring to FIGS. 1 and 5, the read voltage included in the first read voltage group (Vrd_G1) may be applied to one page (or memory cells connected to one word line) of the first plane 111. For example, the read voltage included in the first read voltage group (Vrd_G1) may be a first read voltage Vrd1 and a second read voltage Vrd2 (see FIG. 4 which illustrates Vrd1-Vrd7 and E). The graph illustrated in FIG. 5 illustrates power noise that may be generated in a bit line precharge operation section in a read operation where the first read voltage Vrd1 or the second read voltage Vrd2 is applied to the first plane 111.

A suspend time may be set up as a section where a magnitude of power noise POW_N is greater than a reference power Pref. In the case of the first read voltage Vrd_G1, the suspend time may be set up as a first suspend time (SPD_T11). As shown in FIG. 5, the first suspend time SPD_T11 is a period of time where the POW_N is greater than the power reference. For example, an operation of the second plane 112 that overlaps the bit line precharge operation section of the first plane 111 may be delayed for the first suspend time (SPD_T11).

FIG. 6 is a graph illustrating power noise generated when a read voltage included in a second read voltage group (Vrd_G2) is applied. In comparison with FIG. 5, a second suspend time in FIG. 6 may be longer than the first suspend time, as the time in which the power noise is larger than the reference power is longer than the first suspend time in FIG. 5. Referring to FIGS. 1, 5 and 6, the read voltage included in the second read voltage group (Vrd_G2) may be applied to one page (or memory cells connected to one word line) of the first plane 111. For example, the read voltage included in the second read voltage group (Vrd_G2) may be a third read voltage Vrd3, a fourth read voltage Vrd4, and a fifth read voltage Vrd5. The graph illustrated in FIG. 6 illustrates power noise that may be generated in a bit line precharge operation section in a read operation where one of the third read voltage Vrd3, the fourth read voltage Vrd4, and the fifth read voltage Vrd5 is applied to the first plane 111.

In the case of the second read voltage Vrd_G2 of FIG. 6, the suspend time may be set up as a second suspend time (SPD_T12). The second suspend time (SPD_T12) may be longer than the first suspend time (SPD_T11). For example, an operation of the second plane 112 that overlaps the bit line precharge operation section of the first plane 111 may be delayed for the second suspend time (SPD_T12).

FIG. 7 is a graph illustrating a power noise generated when a read voltage included in a third read voltage group (Vrd_G3) is applied. Referring to FIGS. 1, 5 and 7, the read voltage included in the third read voltage group (Vrd_G3) may be applied to one page (or memory cells connected to one word line) of the first plane 111. For example, the read voltage included in the third read voltage group (Vrd_G3) may be a sixth read voltage Vrd6 and a seventh read voltage Vrd7 (see FIG. 4). The graph illustrated in FIG. 7 illustrates power noise that may be generated in a bit line precharge operation section in a read operation where the sixth read voltage Vrd6 or the seventh read voltage Vrd7 is applied to the first plane 111.

In the case of the third read voltage Vrd_G3, the suspend time may be set up as a third suspend time (SPD_T13). The third suspend time (SPD_T13) may be longer than the second suspend time (SPD_T12). For example, an operation of the second plane 112 that overlaps the bit line precharge operation section of the first plane 111 may be delayed for the third suspend time (SPD_T13). The third suspend time (SPD_T13) may be the same as the bit line precharge time of the first plane 111.

The suspend time, which is set up on each of the first through third read voltage groups (Vrd_G1 to Vrd_G3), may be managed by a suspend time table STT (FIG. 2 shows an example where the STT may stored in the register circuit 141). The suspend time table STT will be described in detail with reference to FIG. 8.

FIG. 8 is a mapping table illustrating a suspend time on a read voltage according to example embodiments of the inventive concept. Referring to FIG. 8, a first suspend time table STT1 may include information about a read voltage level (Vrd_LEV) and information about suspend time (SPD_T).

The first read voltage group Vrd_G1 includes the first read voltage Vrd1 and the second read voltage Vrd2. The second read voltage group Vrd_G2 includes the third through fifth read voltages (Vrd3 to Vrd5). The third read voltage group Vrd_G3 includes the sixth read voltage Vrd6 and the seventh read voltage Vrd7. A person of ordinary skill in the art should understand and appreciate that the inventive concept is not limited to the read voltage groups as discussed herein above.

The suspend time SPD_T on the first read voltage group Vrd_G1 may be set kip as a first suspend time SPD_T11. In addition, the suspend time SPD_T on the second read voltage group Vrd_G2 may be set up as a second suspend time SPD_T12. The suspend time SPD_T on the third read voltage group Vrd_G3 may be set up as a third suspend time SRD_T13. Each of the first through third suspend time (SPD_T11 to SPD_T13) may be a reference time provide for variable control of a delay time of an operation section affected by power noise.

The first, second, and through third read voltage groups (Vrd_G1, Vrd_G2, Vrd_G3) of the first suspend time table STT1 may be changed. For example, the memory controller may periodically check a performance of the nonvolatile memory device 100 and may change a read voltage included in each of the first, second, and third read voltage groups (Vrd_G1, Vrd_G2, and Vrd_G3) according to a change of the performance of the nonvolatile memory device 100. The memory control may also adjust each of the first through third suspend time (SPD_T11 to SPD_T13) according to a change of the performance of the nonvolatile memory device 100. As another example, the first suspend time table STT1 may be updated by a user of a nonvolatile memory system including the nonvolatile memory device 100.

Figure 9:
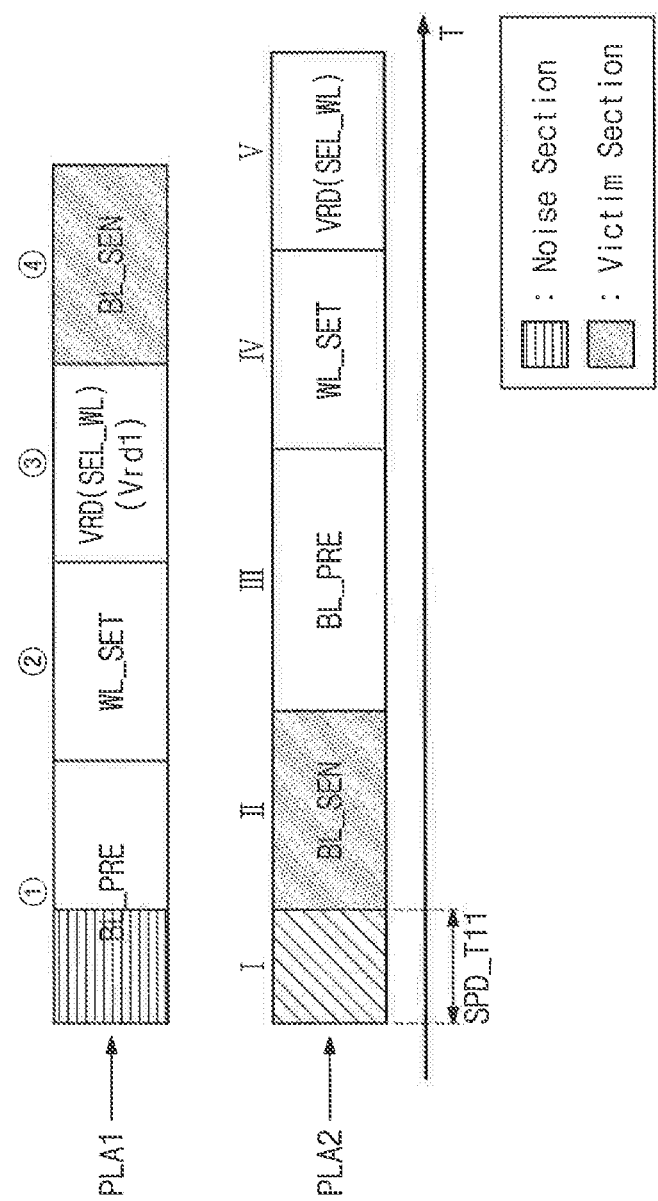
FIG. 9 illustrates a read operation performed in the second plane PLA2 when a read operation by the first read voltage Vrd1 is performed in the first plane PLA1.

FIGS. 9 through 12 are drawings illustrating sub operations on a read operation in a nonvolatile memory device of FIG. 1. FIG. 9 illustrates a read operation performed in the second plane PLA2 when a read operation by the first read voltage Vrd1 is performed in the first plane PLA1.

Referring to FIG. 9, the first through fourth sub-operations (①~④) may be executed to perform the read operation of the first plane PLA1. The first sub-operation ① may be, for example, a bit line precharge operation and the second sub-operation ② may be, for example, an unselect word line setup operation. The third sub-operation ③ may be, for example, an operation where a read voltage is applied to a select word line and the fourth sub-operation ④ may be a bit line sensing operation. For example, partial sections of the first sub-operation ① may be, for example, a noise section and the fourth sub-operation ④ may be a victim section.

Second through fifth sub-operations (II to V) may be performed on the read operation of the second plane PLA2. A first sub-operation (I) of the second plane PLA2 is a delay operation where a victim section is delayed so that the noise section does not overlap the victim section. The second sub-operation (II) is a bit line sensing operation and the third sub operation (III) is a bit line precharge operation. The fourth sub-operation (IV) is an unselect word line setup operation and the fifth sub-operation (V) is an operation where a read voltage is applied to a select word line. For example, the second sub-operation (II) may be a victim section. The fourth sub-operation ④ of the first plane PLA1 may be the same operation as the second sub-operation (II) of the second plane PLA2.

Referring to FIGS. 1, 8 and 9, bit lines BL connected to the first plane PLA1 may be precharged with a positive voltage ①. An setup operation of word lines WL connected to the first plane PLA1 may be performed ②. For example, an unselect read voltage Vread may be applied to unselect word lines connected to the first plane PLA1.

After the unselect read voltage Vread is applied to the unselect word lines, a read voltage may be applied to a select word line SEL_WL connected to a selected page ③. In this case, the read voltage may be the first read voltage Vrd1. To read data of the selected page of the first plane PLA1, the input/output circuit 130 may sense a voltage of the bit lines BL ④. Sensing data determined according to the sensing voltage may be latched to a plurality of latches (not shown) included inside the input/output circuit 130.

Partial sections of the read operation of the first plane PLA1 may overlap partial sections of the read operation of the second plane PLA2. For example, a noise section in the read operation of the first plane PLA1 may overlap a victim section of the second plane PLA2. The noise section may be a part of a bit line precharge section of the first plane PLA1 and the victim section may be a bit line sensing section of the second plane PLA2. In this case, the bit line sensing section on the second plane PLA2, which is a victim section, may be delayed for a reference time.

Referring to FIG. 9, a bit line sensing operation connected to a second plane PLA2 may be delayed for the first suspend time SPD_T11 (I). Referring to FIG. 5, the first suspend time SPD_T11 is the time in a section where a magnitude of the power noise POW_N rises higher than the reference power Pref. More specifically, when a read operation on the selected page of the first plane PLA1 is performed using the first read voltage Vrd1, the bit line sensing operation of the second plane PLA2 that overlaps the bit line precharge operation section of the first plane PLA1 may be delayed for the first suspend time SPD_T11.

After the first suspend time SPD_T11, a voltage of bit lines BL connected to the second plane PLA2 may be sensed by the input/output circuit 130 (II). Sensing data determined according to the sensing voltage may be latched to a plurality of latches (not shown) included inside the input/output circuit 130.

After the sensing operation and the latch operation, the bit lines BL connected to the second plane PLA2 may be precharged with a positive voltage to perform a next read operation. Then, a setup operation of word lines WL connected to the second plane PLA2 may be performed (IV). For example, the unselect read voltage Vread may be applied to unselect word lines connected to the second plane PLA2. After the unselect read voltage Vread is applied, a read voltage may be applied to the select word line SEL_WL connected to the selected page (V).

In the case where a read operation by the second read voltage Vrd2 is performed in the first plane PLA1, the bit line sensing operation of the second plane PLA2 may be delayed for the first suspend time SPD_T11 during the bit line precharge operation section of the first plane PLA1.

Figure 10:
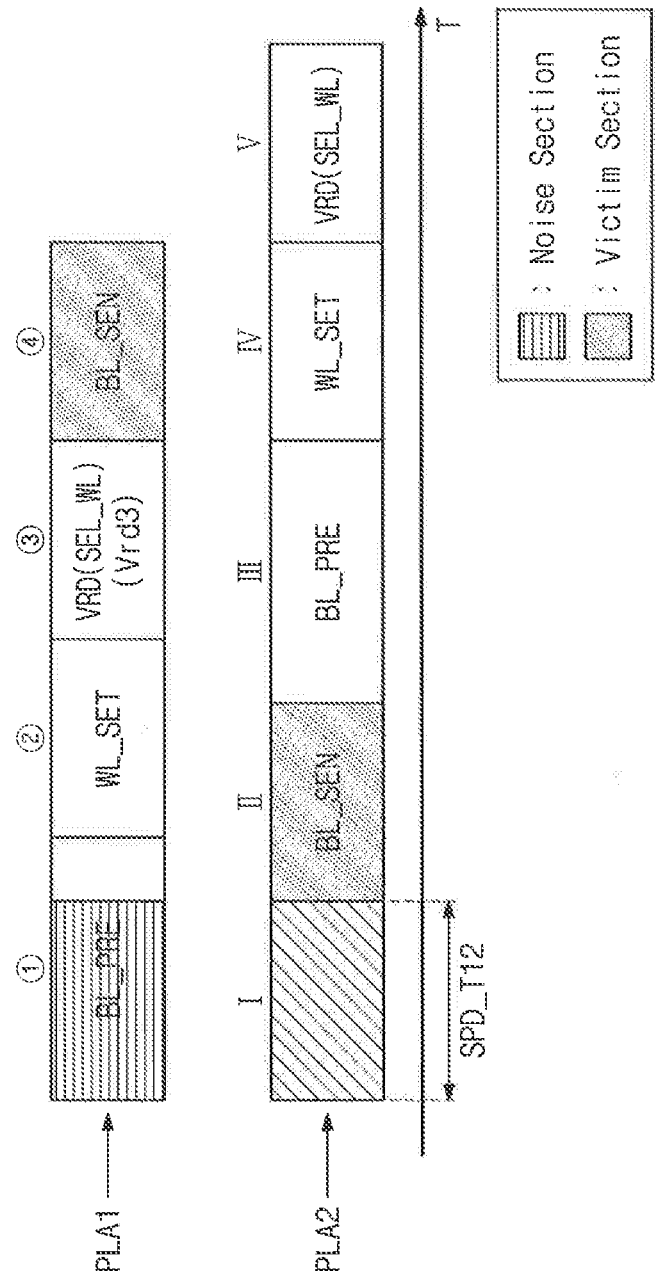
FIG. 10 illustrates a read operation performed in the second plane PLA2 when a read operation by the third read voltage Vrd3 is performed in the first plane PLA1.

FIG. 10 illustrates a read operation performed in the second plane PLA2 when a read operation by the third read voltage Vrd3 is performed in the first plane PLA1. Sub-operations (①~④) performed on the first plane PLA1 illustrated in FIG. 10 is similar to or the same as the sub-operations (①~④) illustrated in FIG. 9. Thus, description of the same sub-operations is omitted.

After an unselect read voltage Vread is applied to unselect word lines connected to the first plane PLA1 ②, a read voltage may be applied to a select word line SEL_WL connected to a selected page ③. In this case, the read voltage may be the third read voltage Vrd3.

Partial sections of the read operation of the first plane PLA1 may overlap partial sections of the read operation of the second plane PLA2. For example, a part of a bit line precharge section of the first plane PLA1 may be a noise section and a bit line sensing section of the second plane PLA2 may be a victim section. In this case, the bit line sensing section of the second plane PLA2, which is a victim section, may be delayed for a reference time.

Referring to FIG. 10, the bit line sensing operation of the second plane PLA2 may be delayed for a second suspend time SPD_T12 (I). Referring to FIG. 6, the second suspend time SPD_T12 is a time on a section where a magnitude of the power noise POW_N rises higher than the reference power Pref. More specifically, when a read operation on the selected page of the first plane PLA1 is performed using the third read voltage Vrd3, the victim section of the second plane PLA2 that overlaps the noise section of the first plane PLA1 may be delayed for the second suspend time SPD_T12.

Referring to FIG. 10, sub-operations (II~V) performed on the second plane PLA2 may be similar to or the same as the sub-operations (II~V) illustrated in FIG. 9. Thus, a description of the same sub-operations is omitted.

In the case where a read operation by the fourth read voltage Vrd4 or the fifth read voltage Vrd5 is performed on the selected page of the first plane PLA1, the victim section of the second plane PLA2 may be delayed for the second suspend time SPD_T12 during the noise section of the first plane PLA1.

Figure 11:
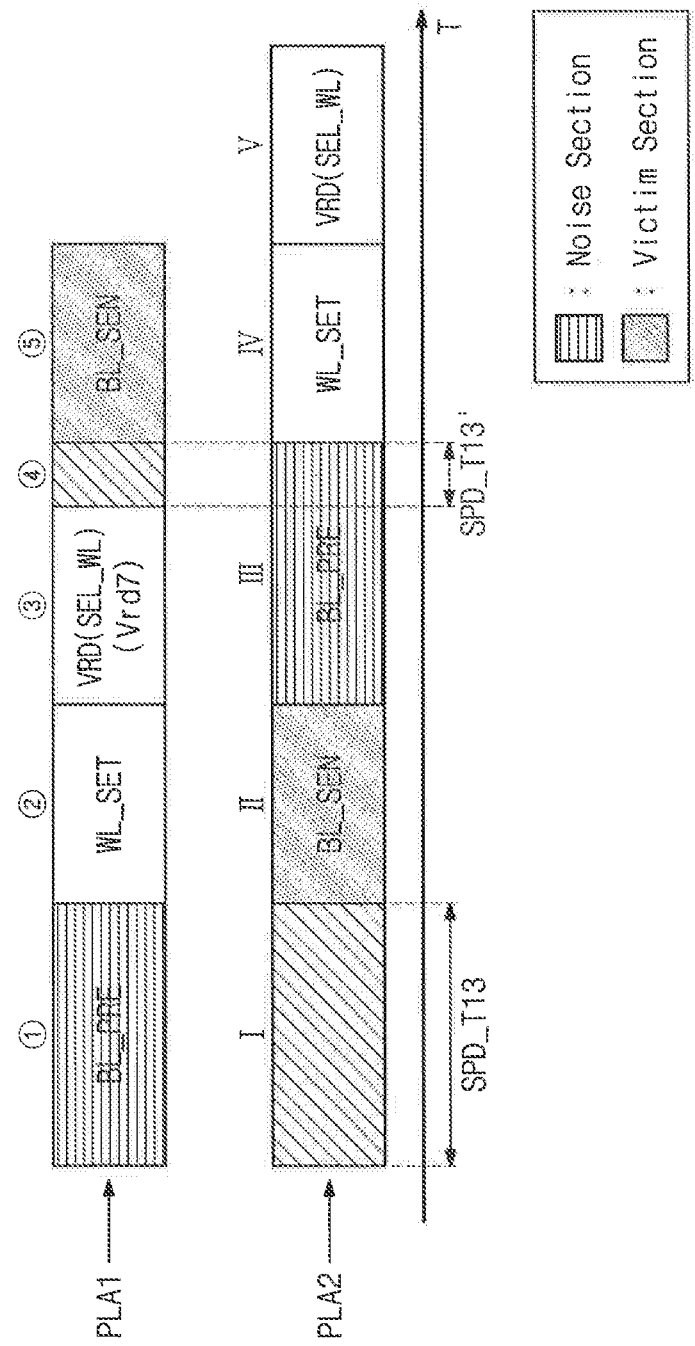
FIG. 11 illustrates a read operation performed in the second plane PLA2 when a read operation by the seventh read voltage Vrd7 is performed in the first plane PLA1.

FIG. 11 illustrates a read operation performed in the second plane PLA2 when a read operation by the seventh read voltage Vrd7 is performed in the first plane PLA1. Sub-operations (①~③) performed on the first plane PLA1 illustrated in FIG. 11 is similar to or the same as the sub-operations (①~③) illustrated in FIGS. 9 and 10. Thus, description of the same sub-operations is omitted.

After an unselect read voltage Vread is applied to unselect word lines connected to the first plane PLA ②, a read voltage may be applied to a select word line SEL_WL connected to a selected page ③. In this case, the read voltage may be the seventh read voltage Vrd7.

Partial sections of the read operation of the first plane PLA1 may overlap partial sections of the read operation of the second plane PLA2. For example, a part of a bit line precharge section of the first plane PLA1 may be a noise section and a bit line sensing section of the second plane PLA2 may be a victim section. In this case, the bit line sensing section on the second plane PLA2 may be delayed for a time indicated as a reference time. Referring to FIG. 11, the bit line sensing section of the second plane PLA2 may be delayed for the third suspend time SPD_T13.

Referring to FIG. 7, the third suspend time SPD_T13 is a time on a section where a magnitude of the power noise POW_N rises higher than the reference power Pref. More specifically, when a read operation on the selected page of the first plane PLA1 is performed using the seventh read voltage Vrd7, the victim section of the second plane PLA2 that overlaps the noise section of the first plane PLA1 may be delayed for the third suspend time SPD_T13. At this time, the third suspend time SPD_T13 may be the same as the bit line precharge time of the first plane PLA1.

Referring to FIG. 11, partial sections of the bit line precharge section of the second plane PLA2 may overlap partial sections of the bit line sensing section of the first plane PLA1. That is, a part of the noise section of the second plane PLA2 may overlap a part of the victim section of the first plane PLA1. In this case, the victim section of the first plane PLA1 may be delayed until the noise section of the second plane PLA2 is completed ④. A suspend time SPD_T13' of the victim section of the first plane PLA1 may be shorter than the third suspend time SPD_T13. After the noise section of the second plane PLA2 is completed, a bit line sensing operation of the first plane PLA1 may be performed ⑤.

Sub-operations (II~V) performed on the second plane PLA2 may be similar to or the same as the sub-operations (II~V) illustrated in FIGS. 9 and 10. Thus, a description of the sub-operations illustrated in FIG. 11 may be omitted.

In the case where a read operation by the sixth read voltage Vrd6 is performed on the selected page of the first plane PLA1, the victim section of the second plane PLA2 that overlaps the noise section of the first plane PLA1 may be delayed for the third suspend time SPD_T13.

Figure 12:
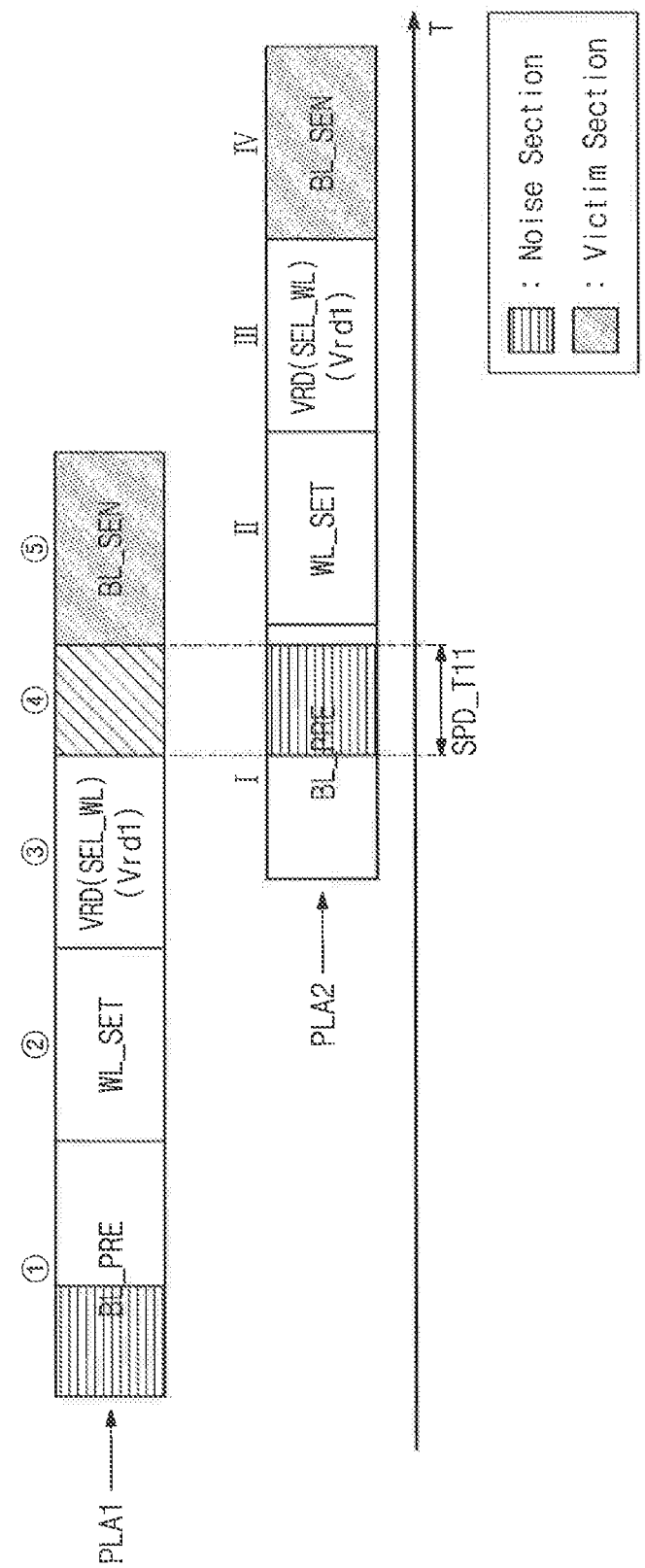
FIG. 12 illustrates a read operation performed in the second plane PLA2 when a read operation by the first read voltage Vrd1 is performed in the first plane PLA1.

FIG. 12 illustrates a read operation performed in the second plane PLA2 when a read operation by the first read voltage Vrd1 is performed in the first plane PLA1.

Sub-operations (①~③) performed on the first plane PLA1 illustrated in FIG. 12 is similar to or the same as the sub operations (①~③) illustrated in FIG. 9. Thus, description of the same sub-operations is omitted.

After the first read voltage Vrd1 is applied to the a select word line SEL_WL connected to a selected page of the first plane PLA1 ③, bit lines BL connected to the first plane PLA1 may be sensed. However, referring to FIG. 12, before a bit line sensing operation of the first plane PLA1 is performed, a bit line precharge operation of a bit line connected to the second plane PLA2 is performed (I). Thus, a read operation of the first plane PLA1 may be delayed as much as partial sections of the bit line precharge operation of the second plane PLA2. More specifically, a part of the bit line precharge operation of the second plane PLA2 may be a noise section and a bit fine sensing section of the first plane PLA1 may be a victim section. In this case, the bit line sensing section of the first plane PLA1, which is victim section, may be delayed for a reference time.

The bit line sensing operation of the first plane PLA1 may be delayed for the first suspend time SPD_T11 (I). When a read operation is performed on the selected page of the first plane PLA1 using the first read voltage Vrd1, the victim section of the first plane PLA1 that overlaps the noise section of the second plane PLA2 may be delayed for the first suspend time SPD_T11.

After the first suspend time SPD_T11, a voltage of bit lines BL connected to the first plane PLA1 may be sensed by the input/output circuit 130 ⑤. Sensing data determined according to the sensing voltage may be latched to a plurality of latches (not shown) included inside the input/output circuit 130.

After a precharge operation is performed on bit lines BL connected to the second plane PLA2, a setup operation may be performed on word lines WL connected to the second plane PLA2 (II). For example, an unselect read voltage Vread may be applied to unselected word lines connected to the second plane PLA2. After the unselect read voltage Vread is applied, the first read voltage Vrd1 may be applied to the select word line SEL_WL connected to the selected page (III). A voltage of the bit lines BL connected to the second plane PLA2 may be sensed by the input/output circuit 130 (IV).

Although not illustrated in FIGS. 9 through 12, the victim section of the second plane PLA2 may be performed before the noise section of the first plane PLA1. At this time, the nonvolatile memory 100 may control the noise section of the first plane PLA1 to be performed after the victim section of the second plane PLA2 is completed.

Referring to FIGS. 9 through 12, in the case where a bit line precharge operation is performed in one plane (e.g., the first plane PLA1), the nonvolatile memory device 100 may temporarily delay a bit line sensing operation of the other plane (e.g., the second plane PLA2). More specifically, the nonvolatile memory device 100 may variably adjust a delay time (e.g., suspend time SPD_T) of an operation of the second plane PLA2 according to a level of a read voltage applied to the select word line SEL_WL of the first plane PLA1.

Figures 13, 14:
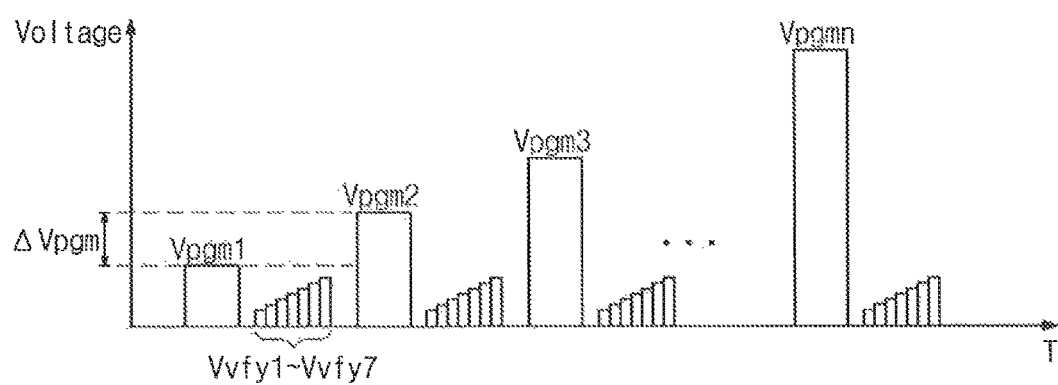
FIG. 13 is a mapping table illustrating an example suspend time on a read voltage according to example embodiments of the inventive concept.
FIG. 14 is a graph illustrating a program operation in a nonvolatile memory device of FIG. 1 according to example embodiments of the inventive concept

FIG. 13 is a mapping table illustrating an example suspend time on a read voltage according to example embodiments of the inventive concept. A second suspend time table STT2 may include information about a read voltage level Vrd_LEV and information about a suspend time SPD_T. In the second suspend time table STT2, different suspend times (SPD_T21 to SPD_T27) may be set up on a plurality of read voltage levels (Vrd1 to Vrd7) respectively.

In the case where different suspend times (SPD_T21 to SPD_T27) are set up on the respective read voltage levels (Vrd1 to Vrd7), a read operation of a plane where an operation affected by power noise is performed may be more finely adjusted. Each of the suspend times (SPD_T21 to SPD_T27) may be a reference time to delay an operation affected by power noise.

In with the same manner as the first suspend time table STT1 illustrated in FIG. 8, information included in the second suspend time table STT2 illustrated in FIG. 12 may be updated. For example, the memory controller may periodically check performance of the nonvolatile memory device 100 and may adjust each of the suspend times (SPD_T21 to SPD_T27) according to a change of the performance of the nonvolatile memory device 100. As another example, the second suspend time table STT2 may be updated by a user of a nonvolatile memory system including the nonvolatile memory device 100.

FIG. 14 is a graph illustrating a program operation in a nonvolatile memory device of FIG. 1 according to example embodiments of the inventive concept. In FIG. 14, a horizontal axis indicates a time T and a vertical axis indicates a voltage V. Referring to FIGS. 1 and 14, a plurality of program voltages (Vpgm1 to Vpgmn) may be sequentially applied to a selected word line SEL_WL of at least one of the first plane PLA1 and the second plane PLA2. After the plurality of program voltages (Vpgm1 to Vpgmn) are applied to the selected word line SEL_WL, a plurality of verification voltages (Vvfy1 to Vvfy7) may be applied.

In a first program loop PL1, the first program voltage Vpgm1 may be applied to the selected word line. In a verification operation, the verification voltages (Vvfy1 to Vvfy7) may be sequentially applied to the selected word line. In the case where 3 bits are programmed in each memory cell MC, for example, the verification voltages (Vvfy1 to Vvfy7) are used. If the number of bits programmed in each memory cell MC is changed, the number of verification voltages Vvfy may also be changed.

In the case where a result of a verification operation of the first program loop PL1 is a program fail, a second program loop PL2 may be performed. In the second program loop PL2, the second program voltage Vpgm2 may be applied to the selected word line. For example, a level of the second program voltage Vpgm2 may be set up higher than a level of the first program voltage Vpgm1. In a verification operation, the verification voltages (Vvfy1 to Vvfy7) may be sequentially applied to the selected word line.

In the case where a result of a verification operation of the second program loop PL2 is a program fail operation, a third program loop PL3 may be performed. In the third program loop PL3, the third program voltage Vpgm3 may be applied to the selected word line. For example, a level of the third program voltage Vpgm3 may be set up higher than a level of the second program voltage Vpgm2. In a verification operation, the verification voltages (Vvfy1 to Vvfy7) may be sequentially applied to the selected word line.

In an embodiment of the inventive concept, an amount of power noise that occurs may be different depending on a program loop. As the number of program loops increases, occurrence time of power noise in a bit line setup section may increase. As the number of program loops performed in one plane increases, the number of bit lines that need a bit line setup may increase and because of this, occurrence time of power noise may increase. Power noise that occurs in one plane may affect an operation of the other plane. Thus, an operation of the other plane may be temporarily delayed for a time where power noise occurs in a program operation of one plane. The occurrence time of power noise according to the program loop may be managed as a suspend time. This operation will be described in detail with reference to FIG. 15.

FIG. 15 is a mapping table illustrating an example of a suspend time list according to a program loop of example embodiments of the inventive concept. Referring to FIGS. 13 and 15, a third suspend time table STT3 may include information about a program loop (PGM_LOOP) and information about a suspend time (SPD_T).

A suspend time SPD_T on a first program loop PL1 may be set up as a first suspend time (SPD_T31). A suspend time SPD_T on a second program loop PL2 may be set up as a second suspend time (SPD_T32). A suspend time SPD_T on an nth program loop PLn may be set up as an nth suspend time (SPD_T3n). Each of the suspend times (SPD_T31 to SPD_T3n) is a reference time used to delay an operation affected by power noise.

In the same manner as the first and second suspend time tables (STT1, STT2) illustrated in FIGS. 8 and 13, information included in the third suspend time table STT3 illustrated in FIG. 15 may be updated. The memory controller may periodically check performance of the nonvolatile memory device 100 and may adjust each of the plurality of suspend times (SPD_T31 to SPD_T3n) according to a change of the performance of the nonvolatile memory device 100. As another example, the third suspend time table STT3 may be updated by a user of a nonvolatile memory system including the nonvolatile memory device 100. Program operation with program loop will be described in detail with reference to FIG. 15.

Figure 16:
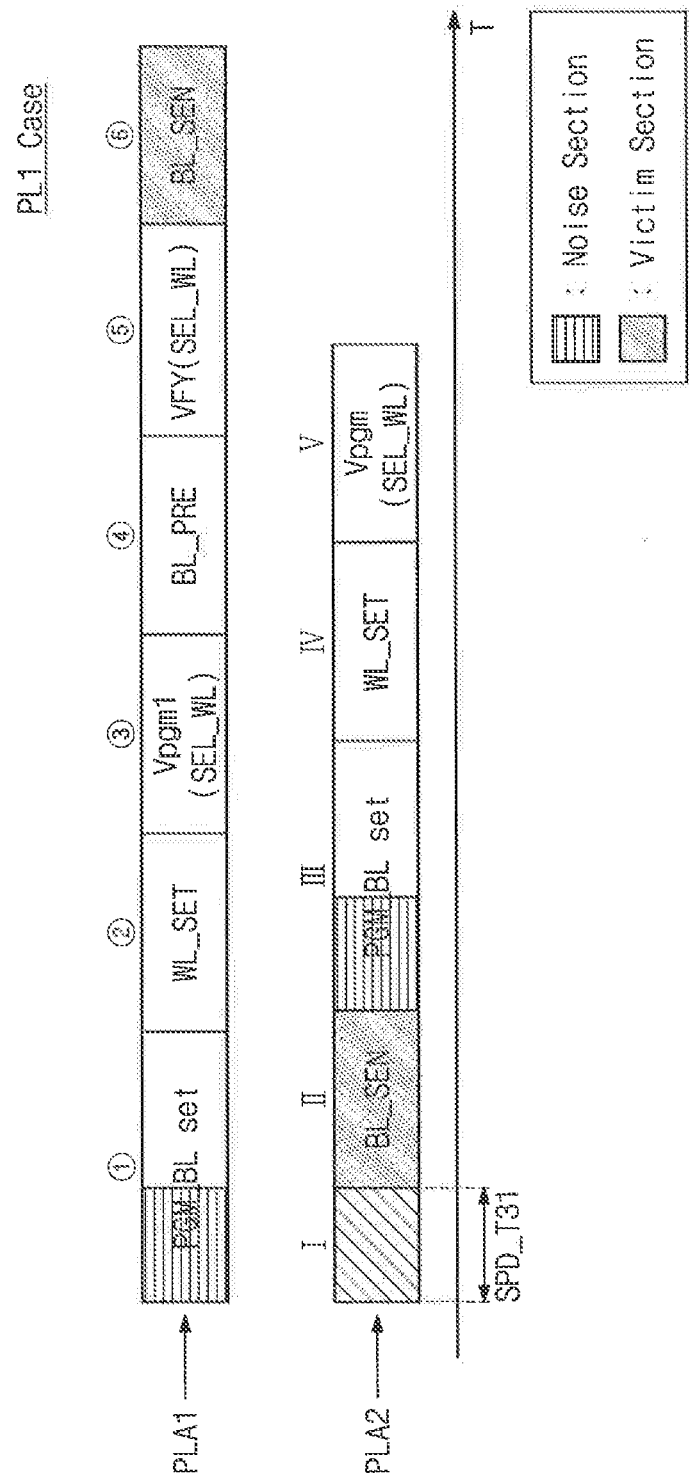
FIG. 16 illustrates a program operation of the second plane PLA2 when a first program loop PL1 is performed on the first plane PLA1.
Figure 17:
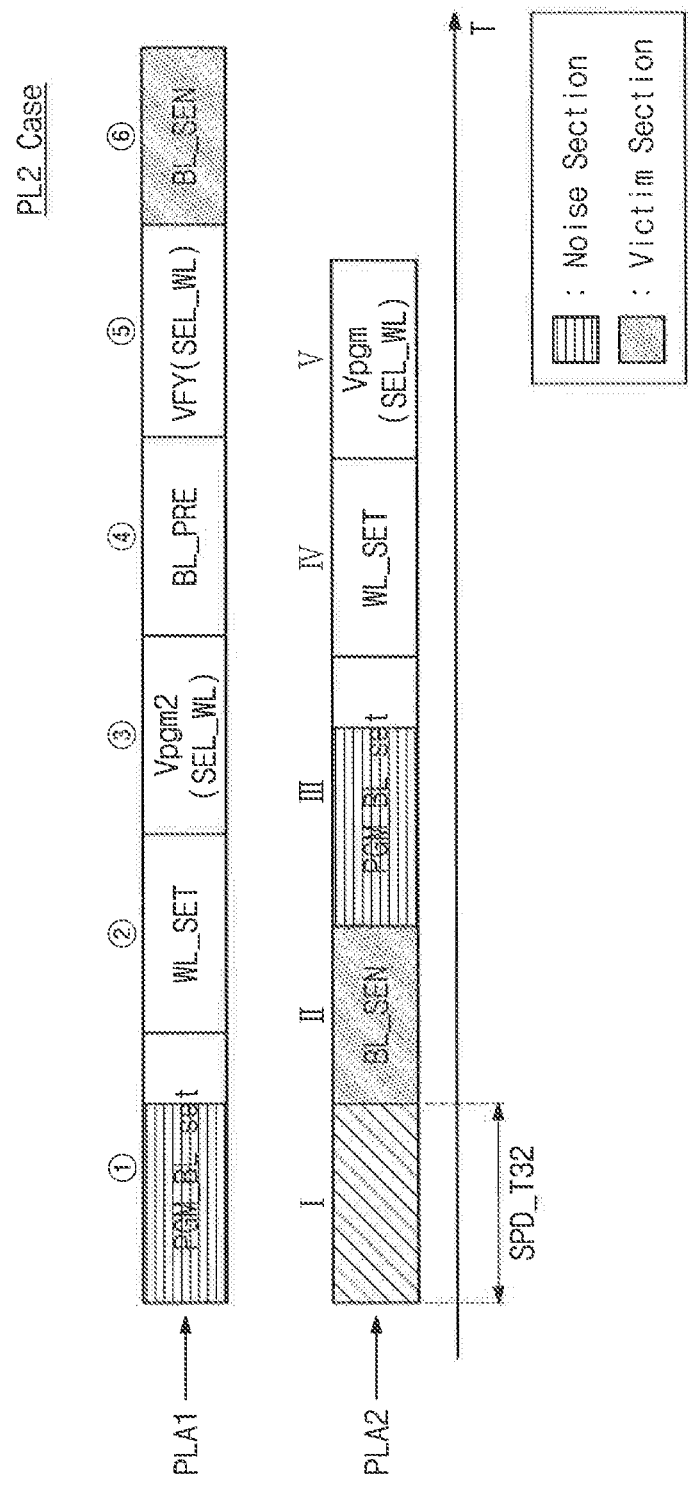
FIG. 17 illustrates a program operation of the second plane PLA2 when a second program loop PL2 is performed on the first plane PLA1.

FIGS. 16 and 17 are drawings illustrating sub-operations on a program operation in a nonvolatile memory device of FIG. 1. FIG. 16 illustrates a program operation of the second plane PLA2 when a first program loop PL1 is performed on the first plane PLA1.

Referring to FIG. 16, first through sixth sub-operations (①~⑥) may be performed on a program operation of the first plane PLA1. The first sub-operation ① may be a bit line setup operation and the second sub-operation ② may be an unselect word line setup operation. The third sub-operation ③ may be an operation where a program voltage is applied to a select word line and the fourth sub-operation ④ may be a bit line precharge operation. The fifth sub-operation ⑤ may be a program verification operation of a select word line and the sixth sub-operation ⑥ may be a bit line sensing operation. Partial sections of the first sub-operation ① may be a noise section and the sixth sub-operation ⑥ may be a victim section.

Second through fifth sub-operations (II~V) may be performed on a program operation of the second plane PLA2. The first sub-operation (I) of the second plane PLA2 is an operation where a victim section is delayed so that a noise section does not overlap the victim section. The second sub-operation (II) is a bit line sensing operation and the third sub-operation (III) is a bit line setup operation. The fourth sub-operation (IV) is an unselect word line setup operation and the fifth sub-operation (V) may be an operation where a program voltage is applied to a select word line. For example, the second sub-operation (II) may be the victim section and partial sections of the third sub-operation may be the noise section. The sixth sub-operation ⑥ of the first plane PLA1 may be the same as the second sub-operation (II) of the second plane PLA2.

Referring to FIGS. 1, 15 and 16, bit lines BL connected to the first plane PLA1 may be set up as a bit line voltage corresponding to data to be programmed (①). A setup operation of word lines WL connected to the first plane PLA1 may be performed (②). For example, a program pass voltage Vpass may be applied to the word lines WL connected to the first plane PLA1.

After the program pass voltage Vpass is applied to the word lines WL, a program voltage may be applied to a select word line (SEL_WL) connected to a selected page (③). In this case, the program voltage may be the first program voltage Vpgm1. The first program voltage Vpgm 1 may be greater than the program pass voltage Vpass.

To verify data of the selected page of the first plane PLA1, bit lines BL connected to the first plane PLA1 may be precharged with a positive voltage (④). A plurality of verification voltages (Vvfy1 to Vvfy7) may be sequentially applied to the selected word line (⑤). To verify data of the selected page of the first plane PLA1, the input/output circuit 130 may sense a voltage of the bit line BL (⑥). Sensing data determined by the sensing voltage may be latched to a plurality of latches (not shown) included in the input/output circuit 130.

The fifth sub-operation ⑤ and sixth sub-operations ⑥ of the first plane PLA1 may be repeated as much as the number of the verification voltages (Vvfy1~Vvfy7). Referring to FIGS. 9 through 11, the bit line precharge operation section of the first plane PLA1 (①) may be an operation section where power noise occurs. Thus, in the case where the bit line precharge operation section of the first plane PLA1 (①) overlaps the bit line sensing operation section (II) of the second plane PLA2, a bit line sensing operation of the second plane PLA2 may be delayed.

Partial (e.g., particular) sections of a program operation of the first plane PLA1 may overlap partial (e.g., particular) sections of a program operation of the second plane PLA2. For example, a noise section in a program operation of the first plane PLA1 and a victim section of a program operation of the second plane PLA2 may overlap with each other. In this case, the noise section may be a part of a bit line setup section of the first plane PLA1 and the victim section may be a bit line sensing section of the second plane PLA2. In this case, the bit line sensing section of the second plane PLA2, which is victim section, may be delayed for a reference time.

Referring to FIG. 16, the bit line sensing operation of the second plane PLA2 may be delayed for the first suspend time (SPD_T31) (I). A program operation may be performed on the selected page of the first plane PLA1 using the first program voltage Vpgm 1. The bit line sensing operation section of the second plane PLA2 that overlaps partial (e.g., particular) sections of the bit line setup operation of the first plane PLA1 may be delayed for the first suspend time (SPD_T31).

After the first suspend time (SPD_T31) occurs, to verify data programmed in the selected page of the second plane PLA2, a voltage of bit lines BL connected to the second plane PLA2 may be sensed by the input/output circuit 130 (II). Sensing data determined according to the sensing voltage may be latched to a plurality of latches (not shown) included in the input/output circuit 130.

After the sensing and latch operations, to perform a next program operation, bit lines BL connected to the second plane PLA2 may be set up as a bit line voltage corresponding to data to be programmed (III). To perform a setup operation of word lines WL connected to the second plane PLA2, a program pass voltage Vpass may be applied to word lines WL connected to the second plane PLA2 (IV). After a program pass voltage Vpass is applied, a program voltage may be applied to a select word line (SEL_WL) connected to the selected page.

FIG. 17 illustrates a program operation of the second plane PLA2 when a second program loop PL2 is performed on the first plane PLA1.

Referring to FIGS. 16 and 17, sub-operations (①~⑥) performed (e.g., executed) on the first plane PLA1 are similar to or the same as the sub-operations (①~⑥) illustrated in FIG. 15. Thus, a description of the same sub-operations is omitted.

After a program pass voltage Vpass is applied to word lines WL connected to the first plane PLA1(②), a program voltage may be applied to a select word line (SEL_WL) connected to the selected page (③). In this case, the program voltage may be the second program voltage Vpgm 2.

Particular sections of the program operation of the first plane PLA1 may overlap particular sections of the program operation of the second plane PLA2. For example, a part of the bit line setup section of the program operation of the first plane PLA1 may be a noise section, and the bit line sensing section of the second plane PLA2 may be a victim section. In this case, the bit line sensing section of the second plane PLA2, which is victim section, may be delayed for the reference time.

Referring to FIG. 17, the bit line sensing operation of the second plane PLA2 may be delayed by as much as (or based on) the second suspend time (SPD_T32) (I). When a program operation on the selected page of the first plane PLA1 is performed using the second program voltage Vpgm 2, a sensing operation of the second plane PLA2 that overlaps partial (e.g., particular) sections of the bit line setup operation of the first plane PLA1 may be delayed for the second suspend time (SPD_T32).

Sub-operations (II~V) performed in the second plane PLA2 illustrated in FIG. 17 may be similar to or the same as the sub-operations (II~V) illustrated in FIG. 15. Thus, a description of the sub-operations (II~V) illustrated in FIG. 17 may be omitted.

As described with reference to FIGS. 16 and 17, as a program loop performed in the first plane PLA1 increases, suspend time of the second plane PLA2 may increase. The nonvolatile memory device 100 according to an embodiment of inventive concept may variably adjust the suspend time based on the program loop performed in the first plane PLA1.

Figure 18:
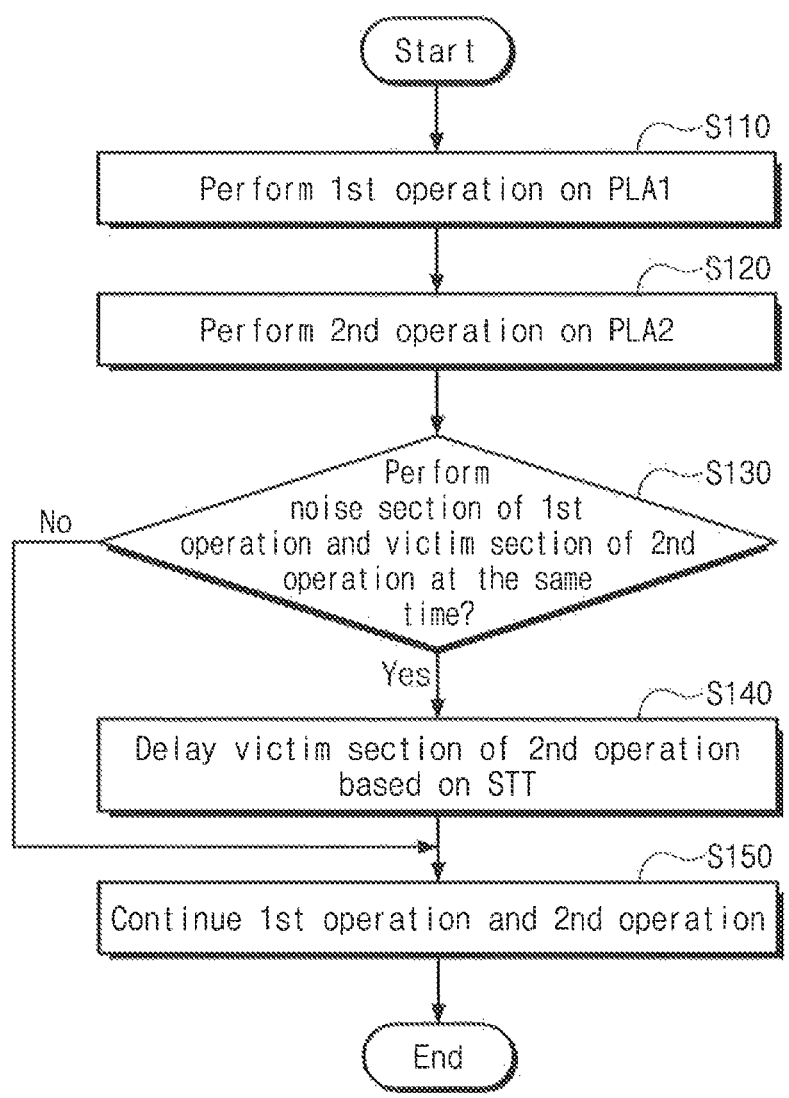
FIG. 18 is a flowchart illustrating a method of operating a nonvolatile memory device of FIG. 1.

FIG. 18 is a flowchart illustrating a method of operating a nonvolatile memory device of FIG. 1. Referring to FIGS. 1 through 18, in an operation S110, the nonvolatile memory device 100 may perform a first operation on the first plane PLA1. The first operation may be, for example, a read operation or a program operation. In an operation S120, the nonvolatile memory device 100 may perform a second operation on the second plane PLA2. The second operation may be, for example, a read operation or a program operation.

In an operation S130, there may be a determination as to whether in the nonvolatile memory device 100 there exists a noise section, which is an operation section, where power noise of the first operation occurs, and a victim section, which is an operation section, affected by power noise of the second operation. In the case where the first operation and the second operation are read operations, the noise section may be a bit line precharge operation section of the first plane PLA1, and the victim section may be a bit line sensing operation section of the second plane PLA2. In the case where the first operation and the second operation are program operations, the noise section may be a bit line setup operation section of the first plane PLA1, and the victim section may be the bit line sensing operation section of the second plane PLA2.

If the noise section of the first operation and the victim section of the second operation exist (Yes), in an operation S140, the nonvolatile memory device 100 may delay execution of an operation affected by power noise of the second operation based on the suspend time table STT. The suspend time table STT may be one of the suspend time tables (STT1, STT2, STT3) illustrated in FIGS. 8, 13 and 15.

After delaying the operation affected by power noise of the second operation, in an operation S150, the nonvolatile memory device 100 may continuously perform execution of the first operation and the second operation. If at S130 the noise section of the first operation and the victim section of the second operation do not exist (No), the nonvolatile memory device 100 continuously perform the first operation and the second operation (S150).

Figure 19:
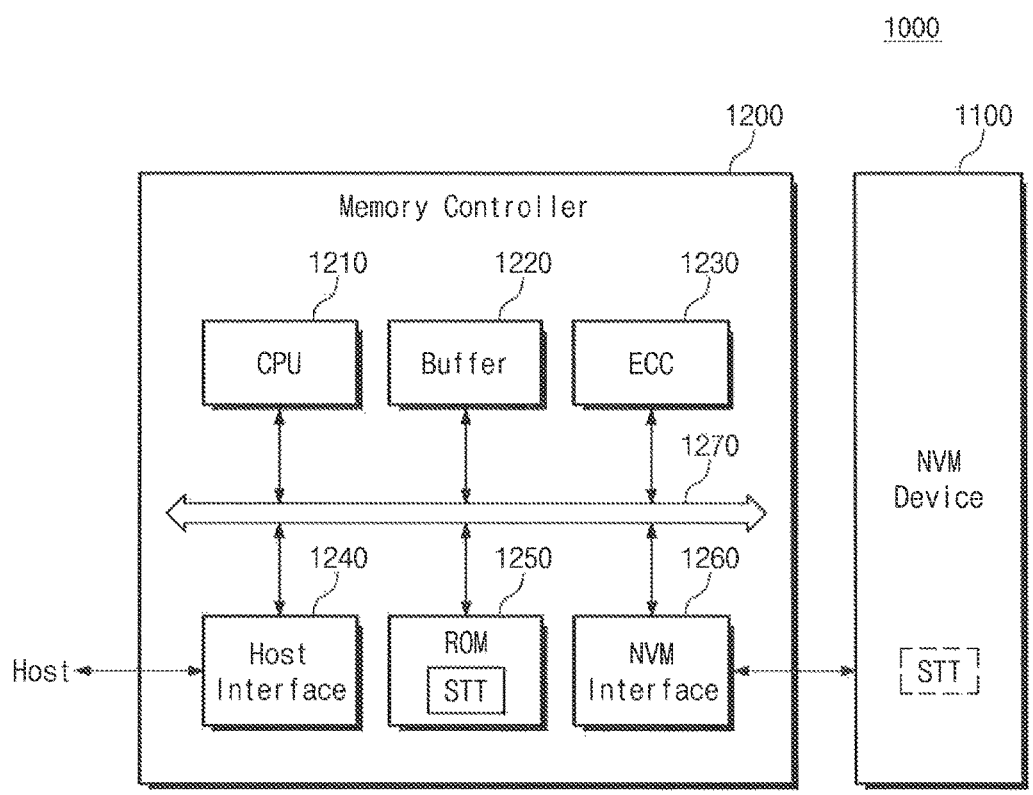
FIG. 19 is a block diagram illustrating a memory system including a nonvolatile memory device of FIG. 1.

FIG. 19 is a block diagram illustrating a memory system including a memory device of FIG. 1. The memory system 1000 may include, for example, a nonvolatile memory device 1100 and a memory controller 1200.

The nonvolatile memory device 1100 is the same as the nonvolatile memory device 100 described with reference to FIGS. 1 through 3. The nonvolatile memory device 1100 may operate as described with reference to FIGS. 4 through 18 with reference to a suspend time table STT received from the memory controller 1200.

The memory controller 1200 may include a central processing unit (CPU) 1210, a buffer 1220, an error correction circuit (ECC) 1230, a host interface 1240, a ROM 1250, and a memory interface 1260.

The CPU 1210 may control an overall operation of the memory controller 1200 and may perform a logical operation. The CPU 1210 may communicate with an external host device through the host interface 1240 and may communicate with the nonvolatile memory device 1100 through the memory interface 1260.

The buffer 1220 may be used as a cache memory or an operation memory of the CPU 1210. When a write request from a host is received, for example, data received from the host may be temporarily stored in the buffer 1220. When a read request from the host is received, data read from the nonvolatile memory device 1100 may be temporarily stored in the buffer 1220. The buffer 1220 may store codes and commands executed by the CPU 1210. For example, the buffer 1220 may include a SRAM (static random access memory).

The error correction circuit (ECC) 1230 may perform an error correction operation. The FCC 1230 may perform an error correction encoding based on data to be written in the nonvolatile memory device 1100. The error correction encoded data may be transmitted to the nonvolatile memory device 1100 through the memory interface 1260. The ECC 1230 may perform an error correction decoding on data received from the nonvolatile memory device 1100.

The host interface 1240 is configured to communicate with the external host device under the control of the CPU 1210. The host interface 1240 may communicate with the external host device using at least one of various communication methods such as a USB (universal serial bus), a SATA (serial AT attachment), a SAS (serial attachment SCSI), a HSIC (high speed interchip), a SCSI (small computer system interface), a PCI (peripheral component interconnection), a PCIe (PCI express), a NVMe (nonvolatile memory express), a UFS (universal flash storage), a SD (secure digital), a MMC (multimedia card), an eMMC (embedded MMC), a DIMM (dual inline memory module), a RDIMM (registered DIMM), a LRDIMM (load reduced DIMM), etc.

The ROM 1250 may store data needed to drive the memory system 1000. For example, the ROM 1250 may store the suspend time table STT described with reference to FIGS. 7, 12 and 14. The suspend time table STT stored in the ROM 1250 may be transmitted to the nonvolatile memory device 1100 through the memory interface 1260 when the memory system 1000 is powered on. The memory interface 1260 may provide an interface with the memory controller 1200.

A system interconnector 1270 is a system bus for providing an on-chip network inside the memory controller 1200. The system interconnector 1270 may include, for example, a data bus, an address bus, and a control bus. A configuration of the system interconnector 1270 is not limited the buses described above and may further include arbitration means for an effective management.

Figure 20:
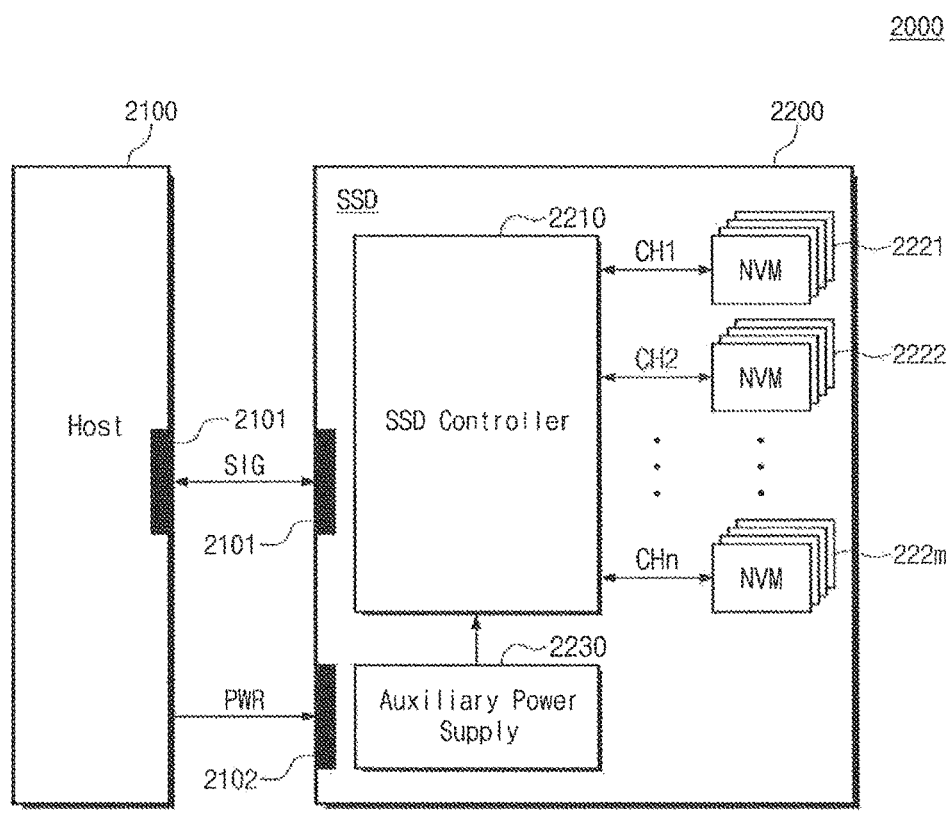
FIG. 20 is a drawing illustrating a solid state drive (SSD) according to example embodiments of the inventive concept.

FIG. 20 is drawing illustrating a solid state drive (SSD) according to example embodiments of the inventive concept. Referring to FIG. 20, a SSD system 2000 may include a host 2100 and a SSD 2200. The SSD 2200 exchanges a signal SIG with the host 2100 through a signal connector 2001 and receives power PWR through a power connector 2002. The SSD 2200 may include a SSD controller 2210, a plurality of memory chips (222*l* to 222*m*), and an auxiliary power supply 2230.

With continued reference to FIG. 20, the SSD controller 2210 may control the plurality of mmemory chips (222*l* to 222*m*) in response to the signal SIG received from the host 2100. Each of the memory chips (222*l* to 222*m*) may include a nonvolatile memory NVM. The memory chips (222*l* to 222*m*) may perform a program operation under a control of the SSD controller 2210.

For example, the SSD controller 2210 may control the memory chips (222*l* to 222*m*) so that a program or read operation is performed in based on the method described with reference to FIGS. 1 through 18. For example, a noise section of one memory chip among the memory chips (222*l* to 222*m*) may overlap a victim section of another memory chip among the memory chips (222*l* to 222*m*). In this case, an operation of the victim section of another memory chip may be delayed for a reference time. The reference time may be the suspend time (SPD_T) described with reference to FIGS. 8, 12 and 15.

The auxiliary power supply 2230 is connected to the host 2100 through the power connector 2002. The auxiliary power supply 2230 may receive power PWR from the host 2100 to charge the auxiliary power supply 2230. If there is not sufficient power supply from the host 2100 for operation, the auxiliary power supply 2230 may provide a power supply of the SSD system 2000. The auxiliary power supply 2230 may be located inside or outside the SSD 2200. For example, the auxiliary power supply 2230 may be located on a main board and may provide auxiliary power to the SSD 2200.

Although not illustrated in the drawing, SSD system 2000 further includes buffer memory. The buffer memory operates as a buffer memory of the SSD 2200. For example, the buffer memory may temporarily store data received from the host 2100, data received from the memory chips (222l to 222m), or meta data (e.g., mapping table (suspend time table (SST1, SST2, SST3))) of the memory chips (222l to 222m). The buffer memory 2240 may include a volatile memory such as DRAM, SDRAM, DDR. SDRAM, LPDDR SDRAM, SRAM, etc. or a nonvolatile memory device such as FRAM, ReRAM, STT-MRAM, PRAM, etc.

The inventive concept may detect power noise that occurs during an operation of some areas from among a plurality of memory areas and may control an operation of the remaining memory areas among the plurality of memory areas except the partial memory areas based on the detected power noise. Thus, the inventive concept may provide a nonvolatile memory device capable of effectively managing an operation of the plurality of memory areas and a memory system including the same.

The contents described above are specific embodiments for implementing the inventive concept. The inventive concept may include not only the embodiments described above but also embodiments in which a design is simply or easily capable of being changed. The inventive concept may also include technologies easily changed to be implemented using the embodiments shown and described herein.

Thus, the scope of the inventive concept is to be determined by the following claims and their equivalents, and shall not be restricted or limited by the foregoing embodiments.

What is claimed is:

1. A nonvolatile memory device comprising:
   a memory cell array including a first plane and a second plane; and
   a control logic circuit configured to execute a first sub-operation on the first plane, and to execute a second sub-operation on the second plane,
   wherein the control logic circuit is further configured to control a delay of an execution of the second sub-operation according to a reference time so that execution of a particular section of the first sub-operation does not overlap execution of the second sub-operation, and the control logic circuit is configured to vary the reference time to increase or decrease the delay of the execution of the second sub-operation,
   wherein the particular section of the first sub-operation indicates a noise section where a power noise occurs, and
   wherein the second sub-operation indicates an operation of a victim section affected by the power noise.

2. The nonvolatile memory device of claim 1, further comprising:
   an address decoder connected to the memory cell array through a plurality of word lines, and configured to selectively provide word line voltages to at least one of the plurality of word lines; and
   a voltage generator configured to generate voltages, which are provided to the address decoder in response to receiving a control signal from the control logic circuit, wherein the voltage generator generates the word line voltages including at least one of a program voltage, a pass voltage, and a program verification voltage.

3. The nonvolatile memory device of claim 1, wherein the first sub-operation indicates a bit line precharge operation of a read operation on the first plane, and
   wherein the second sub-operation indicates a bit line sensing operation of a read operation on the second plane.

4. The nonvolatile memory device of claim 1, wherein the control logic circuit is configured to increase the reference time as a level of a read voltage in a read operation performed on the first plane increases.

5. The nonvolatile memory device of claim 4, wherein the reference time includes a first reference time and a second reference time, and
   when the read operation is executed on the first plane using one of a plurality of first read voltages included in a first read voltage group, the control logic circuit is configured to delay the second sub-operation based on the first reference time,
   wherein when the read operation is performed on the first plane using one of a plurality of second read voltages included in a second read voltage group, the control logic circuit is configured to delay the second sub operation based on the second reference time, wherein the second reference time is greater than the first reference time, and
   wherein the second read voltages are higher than the first read voltages.

6. The nonvolatile memory device of claim 1, wherein the first sub-operation indicates a bit line setup operation of a program operation on the first plane, and
   wherein the second sub-operation indicates a bit line sensing operation of a program operation on the second plane.

7. The nonvolatile memory device of claim 1, wherein the control logic circuit is configured to increase the reference time when a program loop increases in a program operation on the first plane.

8. The nonvolatile memory device of claim 7, wherein the program loop includes a first program loop and a second program loop, and the reference time includes a first reference time and a second reference time,
   when the first program loop is performed on the first plane, the control logic circuit is configured to delay the second sub-operation based on the first reference time, and
   wherein when the second program loop is performed on the second plane, the control logic circuit is configured to delay the second sub-operation based on the second reference time, wherein the second reference time is greater than the first reference time.

9. The nonvolatile memory device of claim 1, wherein the first plane includes first memory blocks which share first bit lines, and
   wherein the second plane includes second memory blocks that share second bit lines.

10. The nonvolatile memory device of claim 1, wherein the control logic circuit comprises:
a register circuit configured to store information about the reference time;
a first plane control circuit configured to store a first command and to control the first sub-operation based on the first command and the information about the reference time; and
a second plane control circuit configured to store a second command and to control the second sub-operation based on the second command and the information about the reference time.

11. The nonvolatile memory device of claim 1, wherein the reference time is set based on the particular section of the first sub-operation wherein a magnitude of the power noise is greater than a reference power.

12. The nonvolatile memory device of claim 1, wherein when execution of the second sub-operation is performed prior to execution of the first sub-operation, the control logic circuit is configured to perform the first sub-operation after the second sub-operation is completed.

13. A memory system comprising:
a nonvolatile memory device configured to include a first area and a second area, to execute a first sub-operation on the first area, to execute a second sub-operation on the second area, and to delay execution of the second sub-operation according to a reference time so that execution of a particular section of the first sub-operation does not overlap execution of the second sub-operation; and
a memory controller configured to vary the reference time to increase or decrease the delay of execution of the second sub-operation.

14. The memory system of claim 13, wherein each of the first area and the second area is constituted in units of a memory chip.

15. The memory system of claim 13, wherein the reference time comprises a first reference time and a second reference time, and
when a read operation is performed on the first area using a first read voltage, the second sub-operation is delayed based on the first reference time, and
wherein when the read operation is performed on the first area using a second read voltage higher than the first read voltage, the second sub-operation is delayed based in the second reference time, wherein the second reference time is greater than the first reference time.

16. The memory system of claim 13, wherein the reference time comprises a first reference time and a second reference time, and
when a first program loop is executed on the first area, the execution of the second sub-operation is delayed based on the first reference time, and
wherein when a second program loop is performed on the first area, the second sub-operation is delayed based on the second reference time, wherein the second reference time is longer than the first reference time.

17. A solid state drive (SSD), comprising:
a plurality of memory chips;
an SSD controller configured to:
control execution of a program operation performed by the plurality of memory chips;
determine when operation of a noise section of at least one memory chip from among the memory chips overlaps operation of a victim section of another memory chip from among the plurality of memory chips; and
delay execution of the operation of the victim section of the another memory chip based on a reference time.

18. The SSD according to claim 17, wherein the plurality of memory chips comprise nonvolatile memory chips.

19. The SSD according to claim 17, further comprising a signal connector that receives a signal from a host, and a power connector that receives power from an external source; and
wherein the reference time comprises a suspend time (SPD_T), and a buffer configured to store a mapping table including a suspend time table of the memory chips.

20. The SSD according to claim 19, wherein the SSD controller is configured to vary the reference time.

* * * * *